(12) United States Patent
Kang et al.

(10) Patent No.: US 12,302,514 B2
(45) Date of Patent: May 13, 2025

(54) DISPLAY DEVICE

(71) Applicant: LG DISPLAY CO., LTD., Seoul (KR)

(72) Inventors: ChounSung Kang, Gimpo-si (KR); Daeyun Kim, Seoul (KR); GeunChang Park, Goyang-si (KR)

(73) Assignee: LG Display Co., Ltd. (KR)

( * ) Notice: Subject to any disclaimer, the term of this patent is extended or adjusted under 35 U.S.C. 154(b) by 240 days.

(21) Appl. No.: 18/051,162

(22) Filed: Oct. 31, 2022

(65) Prior Publication Data

US 2023/0164936 A1 May 25, 2023

(30) Foreign Application Priority Data

Nov. 25, 2021 (KR) ........................ 10-2021-0164748

(51) Int. Cl.
*H05K 5/02* (2006.01)
(52) U.S. Cl.
CPC ................... *H05K 5/0217* (2013.01)
(58) Field of Classification Search
CPC ........................ H05K 5/0017; H05K 5/0217

USPC ........................................................ 361/807
See application file for complete search history.

(56) References Cited

U.S. PATENT DOCUMENTS

| | | | |
|---|---|---|---|
| 2021/0007230 A1* | 1/2021 | Kang | H05K 5/03 |
| 2021/0051809 A1* | 2/2021 | Song | G06F 1/1652 |
| 2021/0056872 A1* | 2/2021 | Kwon | H05K 1/189 |
| 2021/0074189 A1* | 3/2021 | Kwon | H05K 5/0217 |
| 2021/0142698 A1* | 5/2021 | Oh | H10K 50/868 |
| 2021/0144868 A1* | 5/2021 | Song | H05K 5/0026 |

FOREIGN PATENT DOCUMENTS

| | | |
|---|---|---|
| JP | 5-246123 A | 9/1993 |
| KR | 10-2204456 B1 | 1/2021 |

* cited by examiner

*Primary Examiner* — Hung S. Bui
(74) *Attorney, Agent, or Firm* — Fish & Richardson P.C.

(57) ABSTRACT

A display device includes a first rolling guide parts and a second rolling guide parts each including at least one of a protruding portion and a groove portion, a connection part having one end fixed to the first rolling guide part and the other end fixed to the second rolling guide part, a back cover connected to the first rolling guide parts and the second rolling guide parts, and a display panel disposed on the back cover to achieve a lightweight rollable display device.

19 Claims, 15 Drawing Sheets

DISPLAY DEVICE

CROSS-REFERENCE TO RELATED APPLICATION

This application claims the priority of Korean Patent Application No. 10-2021-0164748 filed on Nov. 25, 2021, which is hereby incorporated by reference in its entirety.

BACKGROUND

Field of the Disclosure

The present disclosure relates to a display device, and more particularly, to a rollable display device capable of inhibiting a display panel from being bent by moisture.

Description of the Background

As display devices used for a monitor of a computer, a TV set, a mobile phone, and the like, there are an organic light-emitting display (OLED) configured to autonomously emit, and a liquid crystal display (LCD) that requires a separate light source.

The range of application of the display devices is diversified from the monitor of the computer and the TV set to personal mobile devices, and studies are being conducted on the display devices having wide display areas and having reduced volumes and weights.

In addition, recently, a rollable display device, which is made by forming display parts, lines, and the like on a substrate made of a flexible plastic material having flexibility and thus may display images even in a case in which the rollable display device is rolled up, has attracted attention as a next-generation display device.

SUMMARY

Accordingly, the present disclosure is to provide a display device capable of unwinding and winding a display panel by using a lightweight configuration that replaces a roller.

The present disclosure is also to provide a display device capable of minimizing a situation in which a central portion of a display panel and a central portion of a back cover sag when the display panel is wound.

The present disclosure is not limited to the above-mentioned and other features, which are not mentioned above, can be clearly understood by those skilled in the art from the following descriptions.

According to an aspect of the present disclosure, a display device includes a first rolling guide parts and a second rolling guide parts each including at least one of a protruding portion and a groove portion; a connection part having one end fixed to the first rolling guide part and the other end fixed to the second rolling guide part; a back cover seated on the first and second rolling guide parts; and a display panel disposed on the back cover.

According to another aspect of the present disclosure, a display device includes a display panel having a plurality of pixels; a back cover disposed on a rear surface of the display panel so as to be rollable together with the display panel; a first rolling guide parts and a second rolling guide parts around which the back cover and the display panel are wound or unwound, the first and second rolling guide parts each including at least one of a protruding portion and a groove portion and configured such that the back cover is seated on the first and second rolling guide parts; and a connection part having one end and the other end at which the first and second rolling guide parts are disposed.

Other detailed matters of the exemplary aspects are included in the detailed description and the drawings.

The present disclosure may provide a display device, in which the roller is eliminated, and the rolling guide part and the connection part are used, such that the display device is lightweight.

According to the present disclosure, the protruding portions or groove portions of the back cover engage with the groove portions or protruding portions of the rolling guide parts when the back cover is wound. Therefore, the back cover may be wound at the exact position.

According to the present disclosure, the protruding portions or groove portions of the back cover engage with the groove portions or protruding portions of the rolling guide parts when the back cover is wound. Therefore, it is possible to minimize a situation in which the central portion of the wound back cover sags.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1A:
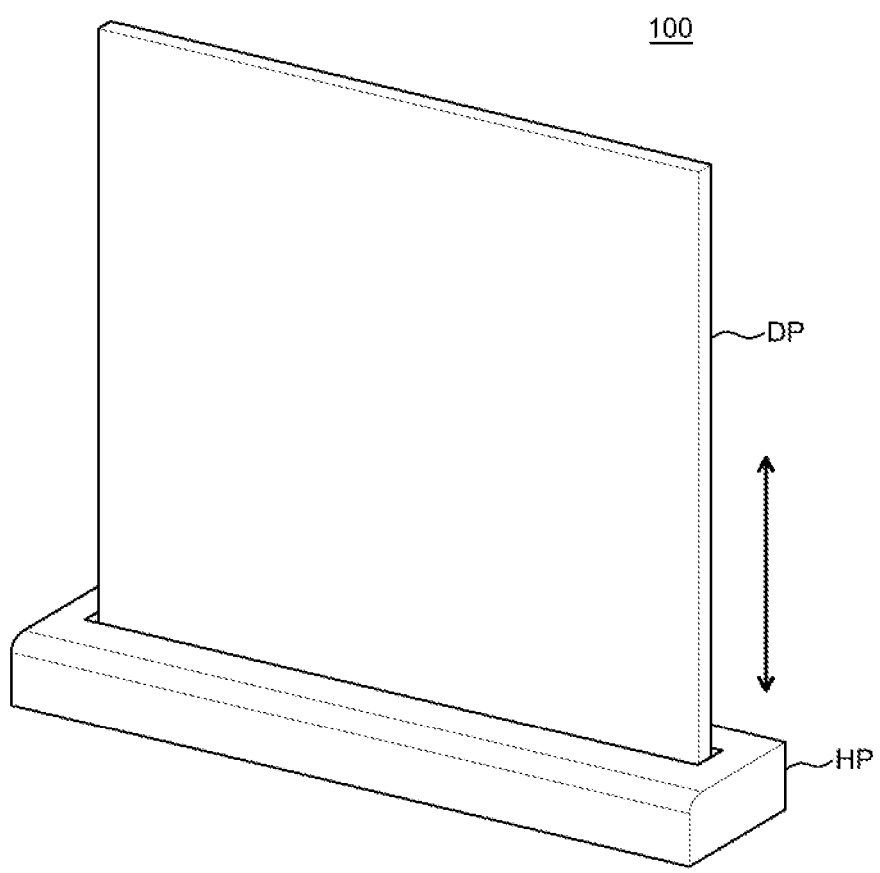
FIGS. 1A and 1B are perspective views of a display device according to an aspect of the present disclosure.

Advantages and characteristics of the present disclosure and a method of achieving the advantages and characteristics will be clear by referring to exemplary aspects described below in detail together with the accompanying drawings. However, the present disclosure is not limited to the exemplary aspects disclosed herein but will be implemented in various forms. The exemplary aspects are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary aspects of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various aspects of the present disclosure can be partially or entirely adhered to or combined with each other and can be interlocked and operated in technically various ways, and the aspects can be carried out independently of or in association with each other.

Hereinafter, various exemplary aspects of the present disclosure will be described in detail with reference to the accompanying drawings.

<Display Device-Rollable Display Device>

A rollable display device refers to a display device capable of displaying images even in a case in which the rollable display device is rolled up. The rollable display device may have higher flexibility than a general display device in the related art. A shape of the rollable display device may be freely changed depending on whether the rollable display device is used. Specifically, when the rollable display device is not used, the rollable display device may be rolled up and stored with a reduced volume. On the contrary, when the rollable display device is used, the rolled-up rollable display device may be unrolled again and used.

Figure 1B:
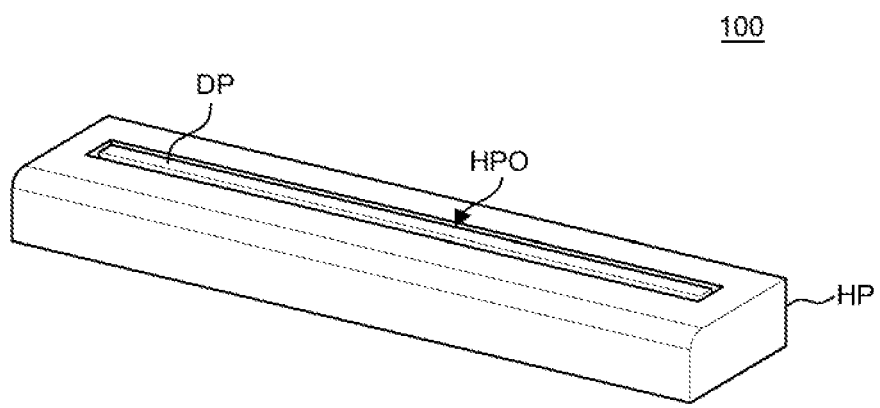

FIGS. 1A and 1B are perspective views of a display device according to an aspect of the present disclosure.

Referring to FIGS. 1A and 1B, a display device 100 according to an aspect of the present disclosure includes a display part DP and a housing part HP.

The display part DP is configured to display images to a user. For example, display elements and circuits, lines, and components for operating the display elements may be disposed on the display part DP. In this case, because the display device 100 according to the aspect of the present disclosure is a rollable display device, the display part DP may be configured to be wound or unwound. For example, the display part DP may include a display panel having flexibility so as to be wound or unwound, and a back cover. The display part DP will be described below in more detail with reference to FIGS. 4A and 4B.

The housing part HP is a casing capable of accommodating the display part DP.

The housing part HP has an opening portion HPO through which the display part DP may move to the outside or the inside of the housing part HP.

Meanwhile, the display part DP of the display device 100 may switch from a fully unwound state illustrated in FIG. 1A to a fully wound state illustrated in FIG. 1B or switch from the fully wound state to the fully unwound state.

A drive part is disposed to wind or unwind the display part DP to switch the display part DP to the fully unwound state or the fully wound state.

<Drive Part>

Figure 2:
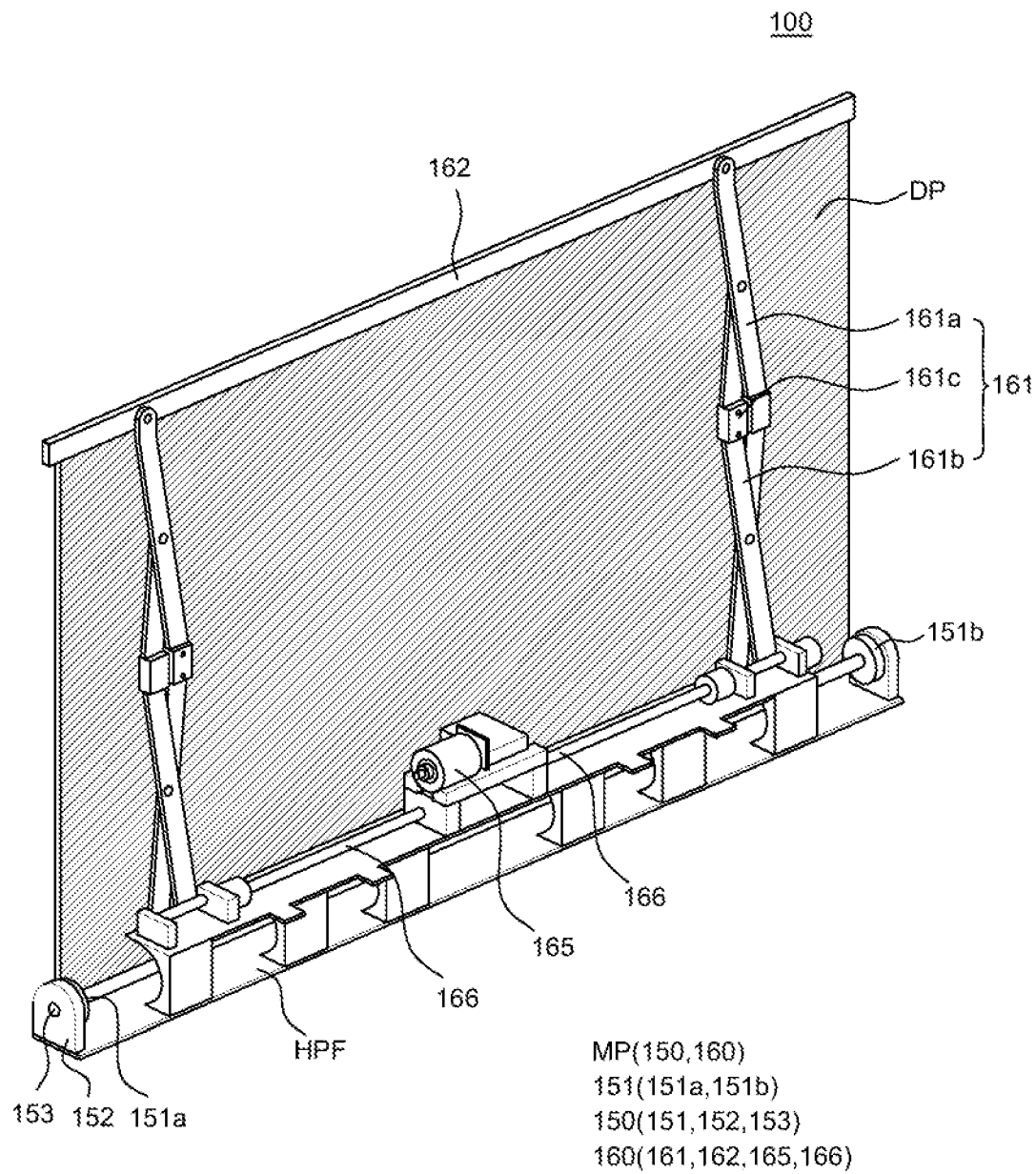
FIG. 2 is a perspective view of the display device according to the aspect of the present disclosure.

FIG. 2 is a perspective view of the display device according to the aspect of the present disclosure.

Figure 3:
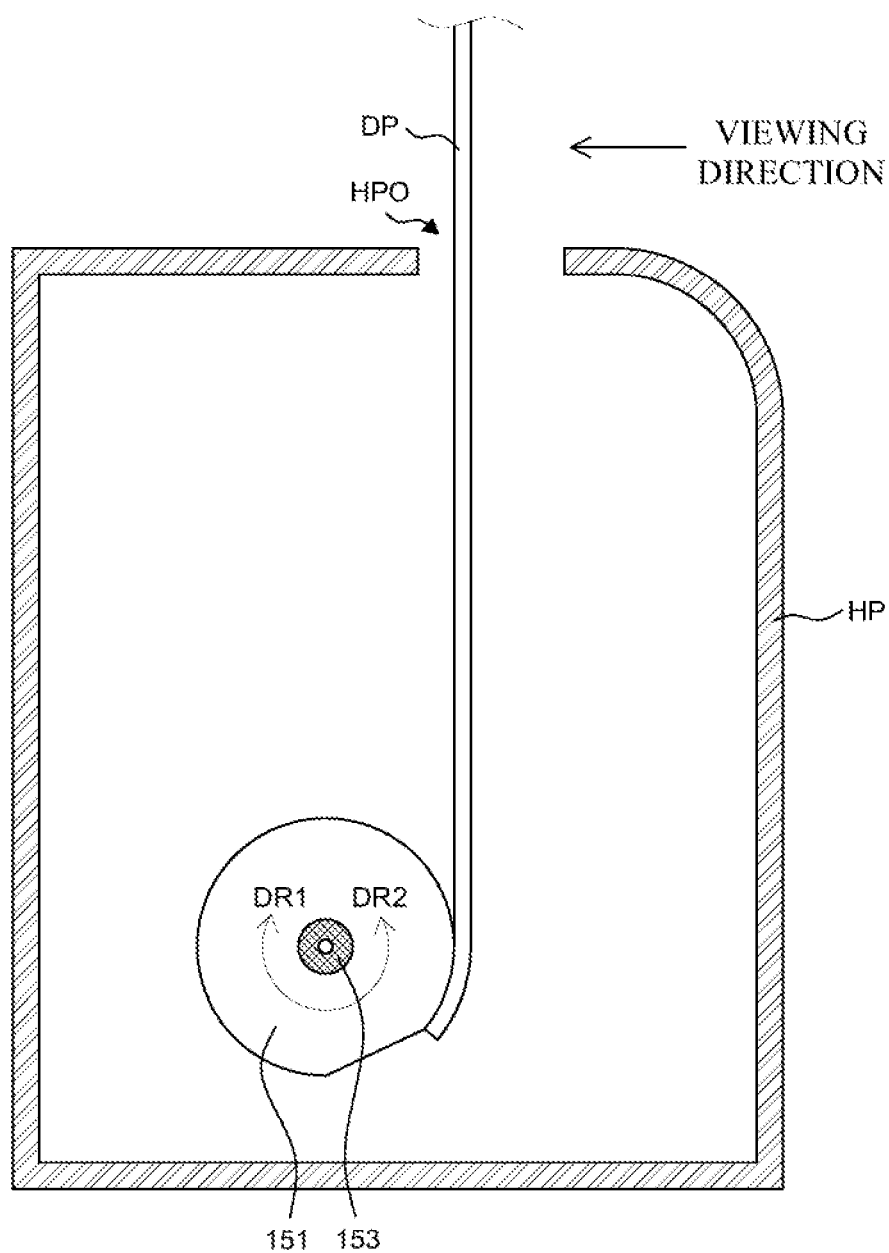
FIG. 3 is a cross-sectional view of the display device according to the aspect of the present disclosure.

FIG. 3 is a cross-sectional view of the display device according to the aspect of the present disclosure.

FIG. 3 is a schematic cross-sectional view for explaining a rolling guide part 151 and the display part DP of the display device 100 according to the aspect of the present disclosure. For the convenience of description, FIG. 3 illustrates only the housing part HP, the rolling guide part 151, and the display part DP.

First, referring to FIG. 2, a drive part MP includes a rolling unit 150 and a lifting unit 160.

The rolling unit 150 winds or unwinds the display part DP, which is fixed to the rolling unit 150, while rotating clockwise or counterclockwise. The rolling unit 150 includes rolling guide parts 151, support parts 152, and a connection shaft 153.

The rolling guide part 151 is a member around which the display part DP is wound. The rolling guide part 151 may be made of plastic or metal, but the present disclosure is not limited thereto. For example, the rolling guide parts 151 may include a first rolling guide part 151a and a second rolling guide part 151b. Two opposite sides of a lower edge of the display part DP may be fixed to the first and second rolling guide parts 151a and 151b.

The first and second rolling guide parts 151a and 151b may be fixed to two opposite ends of the connection shaft 153. That is, the first and second rolling guide parts 151a and 151b are respectively fastened to one end and the other end of the connection shaft 153. The connection shaft 153 may be made of a material having rigidity. For example, the connection shaft 153 may be made of a metallic material such as SST (stainless steel), Invar, or the like. However, the present disclosure is not limited thereto. When the connection shaft 153 rotates, the rolling guide parts 151 rotate together with the connection shaft 153. Therefore, when the connection shaft 153 rotates, the display part DP having the lower edge fixed to the rolling guide parts 151 may be wound around the rolling guide parts 151. In contrast, when the connection shaft 153 rotates in a reverse direction, the display part DP wound around the rolling guide parts 151 may be unwound from the rolling guide parts 151.

Referring to FIG. 3, at least a part of an outer peripheral surface of the rolling guide part 151 may be formed as a flat surface, and the remaining part of the outer peripheral surface of the rolling guide part 151 may be formed as a curved surface. That is, a part of the outer peripheral surface of the rolling guide part 151 is formed to be flat, and the remaining part of the outer peripheral surface of the rolling guide part 151 is formed to be curved.

Referring back to FIG. 2, the support parts 152 support the rolling guide parts 151. Specifically, the support parts 152 respectively support the first and second rolling guide parts 151a and 151b. The support parts 152 are disposed on a bottom surface HPF of the housing part HP. Side surfaces of upper ends of the support parts 152 are coupled to two opposite ends of the rolling guide parts 151. Therefore, the support parts 152 may support the rolling guide parts 151 so that the rolling guide parts 151 are spaced apart from the bottom surface HPF of the housing part HP. In this case, the rolling guide parts 151 may be rotatably coupled to the support parts 152.

The lifting unit 160 moves the display part DP in an upward/downward direction in conjunction with an operation of the rolling unit 150. The lifting unit 160 includes link units 161, a head bar 162, a motor 165, and rotary units 166.

The link unit 161 of the lifting unit 160 includes a plurality of links 161a and 161b, and a hinge 161c configured to connect the plurality of links 161a and 161b. Specifically, the plurality of links 161a and 161b include a first link 161a and a second link 161b. The first link 161a and the second link 161b are rotatably fastened by means of the hinge 161c while intersecting each other in a scissors shape. Therefore, when the link unit 161 moves in the upward/downward direction, the plurality of links 161a and 161b may rotate in a direction toward or away from one another. The link unit 161 may include the plurality of links 161a and 161b that intersect each other. However, the present disclosure is not limited thereto. The link unit 161 may include a single link that does not intersect.

The head bar 162 of the lifting unit 160 is fixed to an uppermost end of the display part DP. The head bar 162 may be connected to the link units 161 and move the display part DP in the upward/downward direction by means of the rotations of the plurality of links 161a and 161b of the link units 161. That is, the display part DP may be moved in the upward/downward direction by the head bar 162 and the link units 161.

The head bar 162 covers only a part of the display part DP adjacent to the edge of the uppermost end of the display part DP so as not to cover an image displayed on a front surface of the display part DP. The display part DP and the head bar 162 may be fixed by a screw, but the present disclosure is not limited thereto.

The motor 165 may be connected to a power generator such as a separate external power source or an embedded battery and supplied with power. The motor 165 generates a rotational force and provides driving power to the rotary unit 166.

The rotary unit 166 is connected to the motor 165 and configured to convert a rotational motion provided from the motor 165 into a rectilinear reciprocating motion. That is, the rotational motion of the motor 165 may be converted into the rectilinear reciprocating motion of a structure fixed to the rotary unit 166. For example, the rotary unit 166 may be implemented as a ball-screw mechanism including a shaft and a nut fastened to the shaft. However, the present disclosure is not limited thereto.

The motor 165 and the rotary unit 166 may operate in conjunction with the link unit 161, thereby moving the display part DP upward or downward. The link unit 161 may have a link structure and be repeatedly folded or unfolded by receiving the driving power from the motor 165 and the rotary unit 166.

Specifically, as the motor 165 may operate, the structure of the rotary unit 166 may rectilinearly move. That is, a part of the rotary unit 166 to which one end of the second link 161b is connected may rectilinearly move. Therefore, one end of the second link 161b may move toward the motor 165, and the plurality of links 161a and 161b are folded, such that a height of the link unit 161 may decrease. In addition, during the process of folding the plurality of links 161a and 161b, the head bar 162 connected to the first link 161a also moves downward, and one end of the display part DP connected to the head bar 162 also moves downward.

Therefore, when the display part DP is fully wound around the rolling guide parts 151, the link unit 161 of the lifting unit 160 is kept folded. That is, when the display part DP is fully wound around the rolling guide parts 151, the lifting unit 160 may have the lowest height. When the display part DP is fully unwound, the link unit 161 of the lifting unit 160 is kept unfolded. That is, when the display part DP is fully unwound, the lifting unit 160 may have the highest height.

Meanwhile, to wind the display part DP, the rolling guide parts 151 may rotate, and the display part DP may be wound around the rolling guide parts 151. Referring to FIG. 3, for example, a lower edge of the display part DP is connected to the rolling guide parts 151. Further, when the rolling guide parts 151 rotates in a first direction DR1, i.e., clockwise, the display part DP may be wound so that only an edge of a rear surface of the display part DP comes into close contact with surfaces of the rolling guide parts 151.

When the display part DP is unwound, the connection shaft 153 and the rolling guide parts 151 may rotate, and the display part DP may be unwound from the rolling guide parts 151. Referring to FIG. 3, for example, when the rolling guide parts 151 rotate in a second direction DR2, i.e., counterclockwise, the display part DP wound around the rolling guide parts 151 may be unwound from the rolling guide parts 151 and disposed outside the housing part HP.

In some aspects, the drive part MP having other structures other than the above-mentioned drive part MP may be applied to the display device 100. That is, the components of the rolling unit 150 and the lifting unit 160 may be changed, some of the components may be eliminated, or other components may be added as long as the components may wind and unwind the display part DP.

<Display Part>

Figure 4A:
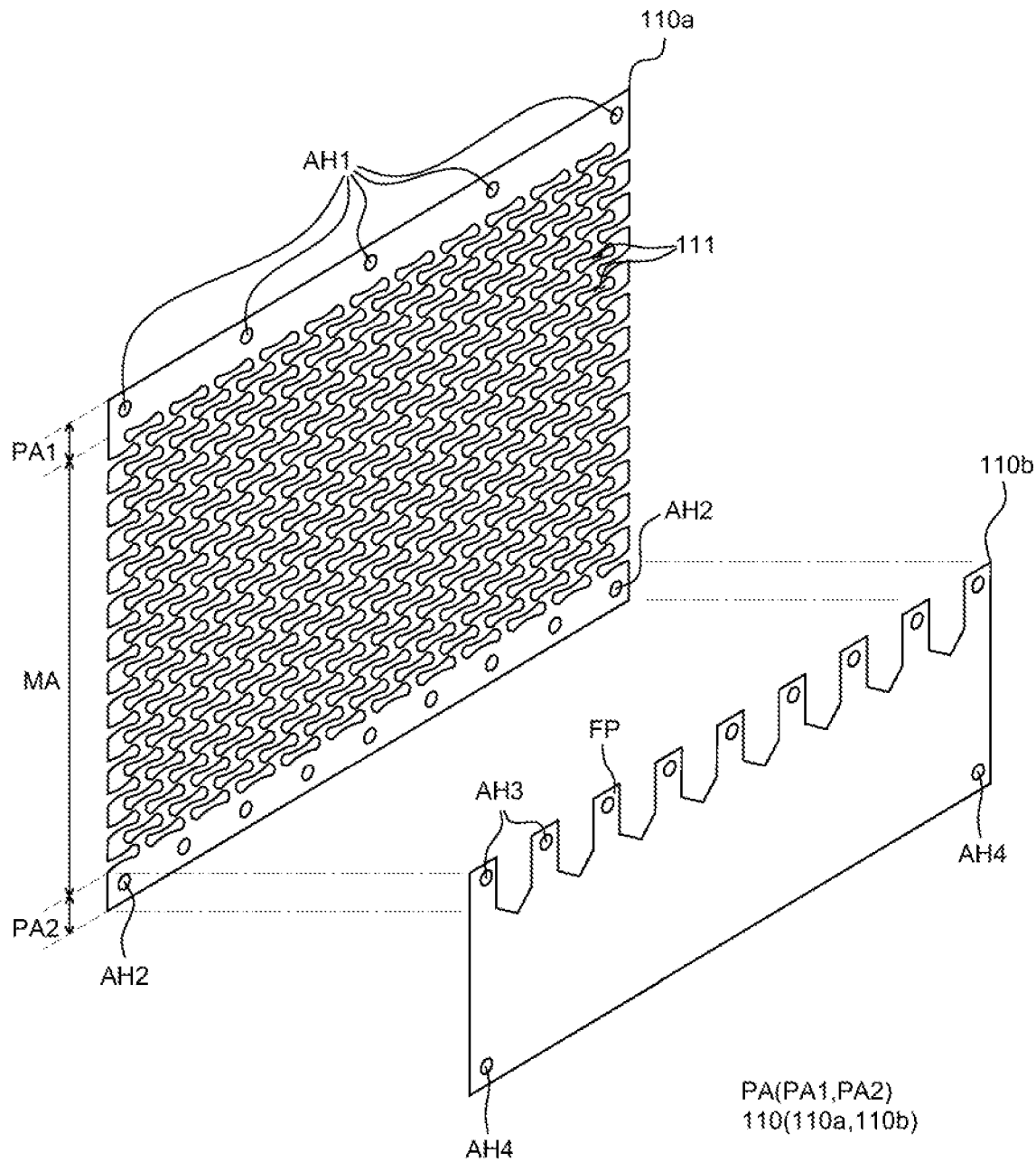
FIG. 4A is an exploded perspective view for explaining a first back cover and a second back cover of the display device according to the aspect of the present disclosure.

FIG. 4A is an exploded perspective view for explaining a first back cover and a second back cover of the display device according to the aspect of the present disclosure.

Figure 4B:
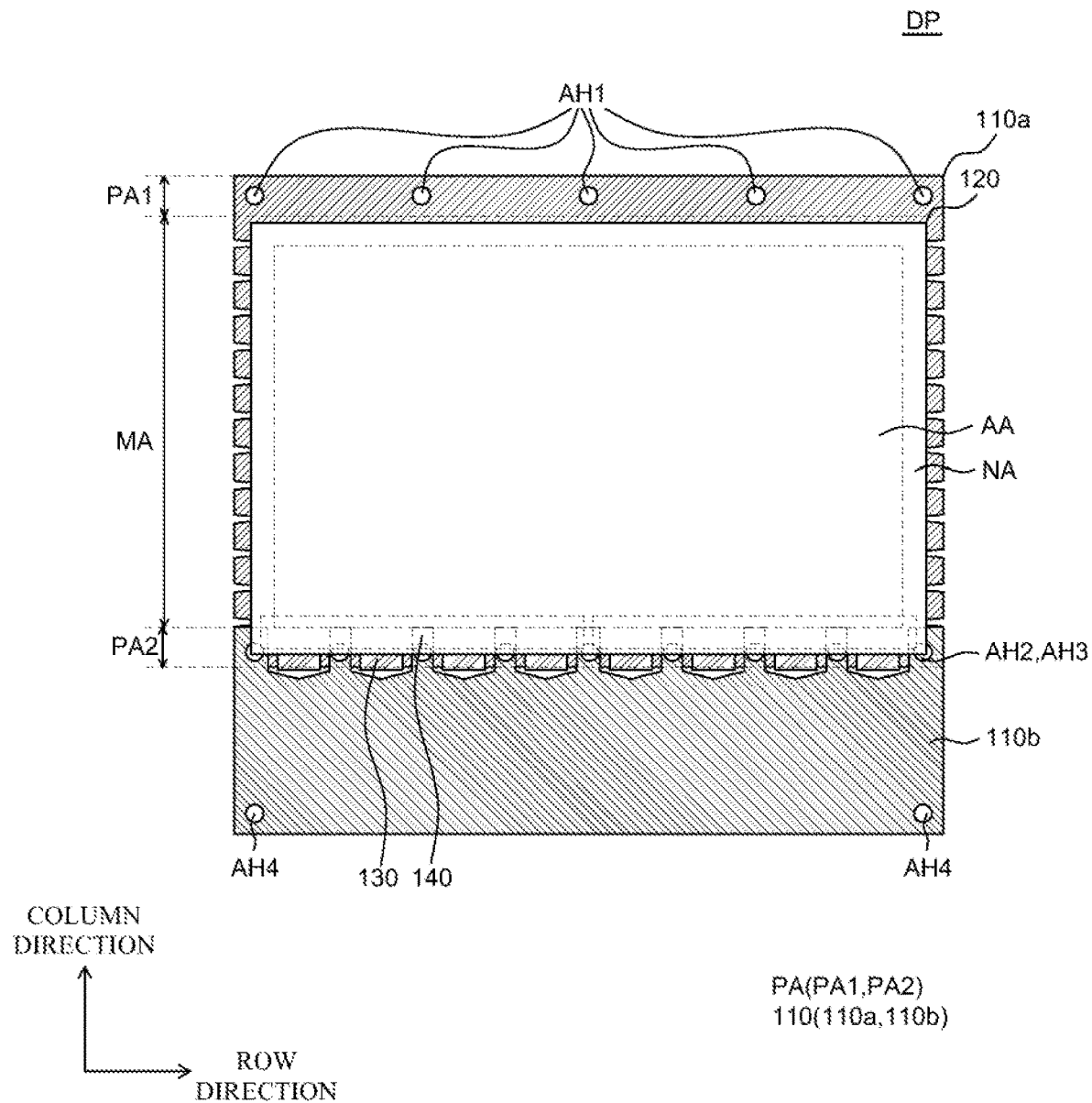
FIG. 4B is a top plan view of a display part of the display device according to the aspect of the present disclosure.

FIG. 4B is a top plan view of the display part of the display device according to the aspect of the present disclosure.

Referring to FIGS. 4A and 4B, the display part DP includes a first back cover 110a, a second back cover 110b, a display panel 120, a plurality of flexible films 130, and a first printed circuit board 140.

Referring to FIGS. 4A and 4B, the first back cover 110a is disposed on a rear surface of the display panel 120 and supports the display panel 120. Because the first back cover 110a is disposed on the rear surface of the display panel 120, the first back cover 110a may be referred to as a back cover. A size of the first back cover 110a may be larger than a size of the display panel 120. The first back cover 110a may protect other components of the display part DP from the outside.

The flexible films 130 electrically connected to one end of the display panel 120 are disposed on one surface of the first back cover 110a. The first printed circuit board 140 electrically connected to the flexible films 130 is disposed on one surface of the first back cover 110a. That is, the first back cover 110a is disposed on rear surfaces of the display panel 120, the flexible films 130, and the first printed circuit board 140 and supports the display panel 120, the flexible films 130, and the first printed circuit board 140. Therefore, the size of the first back cover 110a may be larger than the size of the display panel 120. Meanwhile, the back cover 110 may be divided into the first back cover 110a and the second back cover 110b based on a second support area PA2 of the first back cover 110a.

The first back cover 110a may be made of a material having rigidity. At least a part of the first back cover 110a may have flexibility so as to be wound or unwound together with the display panel 120. For example, the first back cover 110a may be made of a metallic material such as stainless steel (steel use stainless (SUS)) or Invar or a plastic material. However, the material of the first back cover 110a may be variously changed in accordance with design as long as the material of the first back cover 110a satisfies physical property conditions such as a thermal deformation amount, a radius of curvature, rigidity, and the like. However, the present disclosure is not limited thereto.

The first back cover 110a may be fastened to the head bar 162 and the second back cover 110b.

The first back cover 110a includes a plurality of support areas PA and a ductile area MA. The plurality of support areas PA are areas in which a plurality of opening portions 111 are not disposed. The ductile area MA is an area in which the plurality of opening portions 111 are disposed. Specifically, the first back cover 110a includes a first support area PA1, the ductile area MA, and the second support area PA2. The first support area PA1, the ductile area MA, and the second support area PA2 are sequentially disposed from the uppermost end of the first back cover 110a. In this case, because the first back cover 110a is wound or unwound in a Y direction, the plurality of support areas PA and the ductile area MA may be disposed in the Y direction.

The first support area PA1 of the first back cover 110a is an uppermost end region of the first back cover 110a fastened to the head bar 162. First fastening holes AH1 may be formed in the first support area PA1 so that the first support area PA1 is fastened to the head bar 162. For example, screws are disposed to penetrate the first fastening holes AH1 and the head bar 162, such that the head bar 162 and the first support area PA1 may be fastened to each other. Further, because the first support area PA1 is fastened to the head bar 162, the first back cover 110a may also move upward or downward when the link unit 161 fastened to the head bar 162 moves upward or downward. Further, the display panel 120 attached to the first back cover 110a may also move upward or downward. FIGS. 4A and 4B illustrate five first fastening holes AH1. However, the number of first fastening holes AH1 is not limited thereto. In addition, the configuration has been described in which the first back cover 110a is fastened to the head bar 162 by using the first fastening holes AH1. However, the present disclosure is not limited thereto, and the first back cover 110a and the head bar 162 may be fastened to each other without a separate fastening hole.

The ductile area MA of the first back cover 110a is an area extending downward from the first support area PA1 to the lower side of the first back cover 110a. The ductile area MA is an area in which the plurality of opening portions 111 are disposed and to which the display panel 120 is attached. Specifically, the ductile area MA is an area that is wound around or unwound from the rolling guide parts 151, together with the display panel 120. The ductile area MA may overlap at least the display panel 120 among the other components of the display part DP.

The second support area PA2 of the first back cover 110a is a lowermost area of the first back cover 110a that extends from the ductile area MA. One end of the display panel 120 is disposed in the second support area PA2. For example, a pad area, which is a non-display area disposed at one end of the display panel 120, may be disposed in the second support area PA2.

Referring to FIG. 4A, second fastening holes AH2 are disposed in the second support area PA2. The second fastening holes AH2 may be holes for fixing a cover part to be described below, the second back cover 110b, and the first back cover 110a. FIG. 4A illustrates nine second fastening holes AH2. However, the number of second fastening holes AH2 is an example, and the present disclosure is not limited thereto.

Meanwhile, the plurality of opening portions 111, which are formed in the ductile area MA, are not formed in the first support area PA1 and the second support area PA2. Specifically, the first fastening holes AH1 are formed in the first support area PA1, and the second fastening holes AH2 are formed in the second support area PA2. However, the plurality of opening portions 111 formed in the ductile area MA are not formed in the first support area PA1 and the second support area PA2. In addition, the first and second fastening holes AH1 and AH2 are different in shape from the plurality of opening portions 111.

The first support area PA1 is an area fixed to the head bar 162. The second support area PA2 is an area that supports one end of the display panel 120, the plurality of flexible films 130, and the printed circuit board 140. The first and second support areas may have higher rigidity than the ductile area MA. Further, because the first and second support areas PA1 and PA2 have rigidity, the first and second support areas PA1 and PA2 may be securely fixed to the head bar 162 and the second back cover 110b. The second support area PA2 may maintain the first printed circuit board 140 and the pad area at one end of the display panel 120 in a flat shape, thereby protecting the first printed circuit board 140 and the pad area of the display panel 120. Therefore, the display part DP may be fixed to the head bar 162 of the drive part MP and moved to the inside or outside of the housing part HP by the operation of the drive part MP. The second support area may protect the first printed circuit board 140 and the pad area at one end of the display panel 120.

Meanwhile, FIG. 4A illustrates that the plurality of support areas PA and the ductile area MA of the first back cover 110a are sequentially disposed in a column direction. However, in a case in which the first back cover 110a is wound in a row direction, the plurality of support areas PA and the ductile area MA may be disposed in the row direction.

The plurality of opening portions 111 disposed in the ductile area MA of the first back cover 110a may be deformed by stress applied to the display part DP while the display part DP is wound or unwound. Specifically, the ductile area MA of the first back cover 110a may be deformed as the plurality of opening portions 111 contract or expand while the display part DP is wound or unwound. Further, because the plurality of opening portions 111 contract or expand, a slip of the display panel 120 disposed in the ductile area MA of the first back cover 110a is minimized, such that stress to be applied to the display panel 120 may be minimized.

Figure 5:
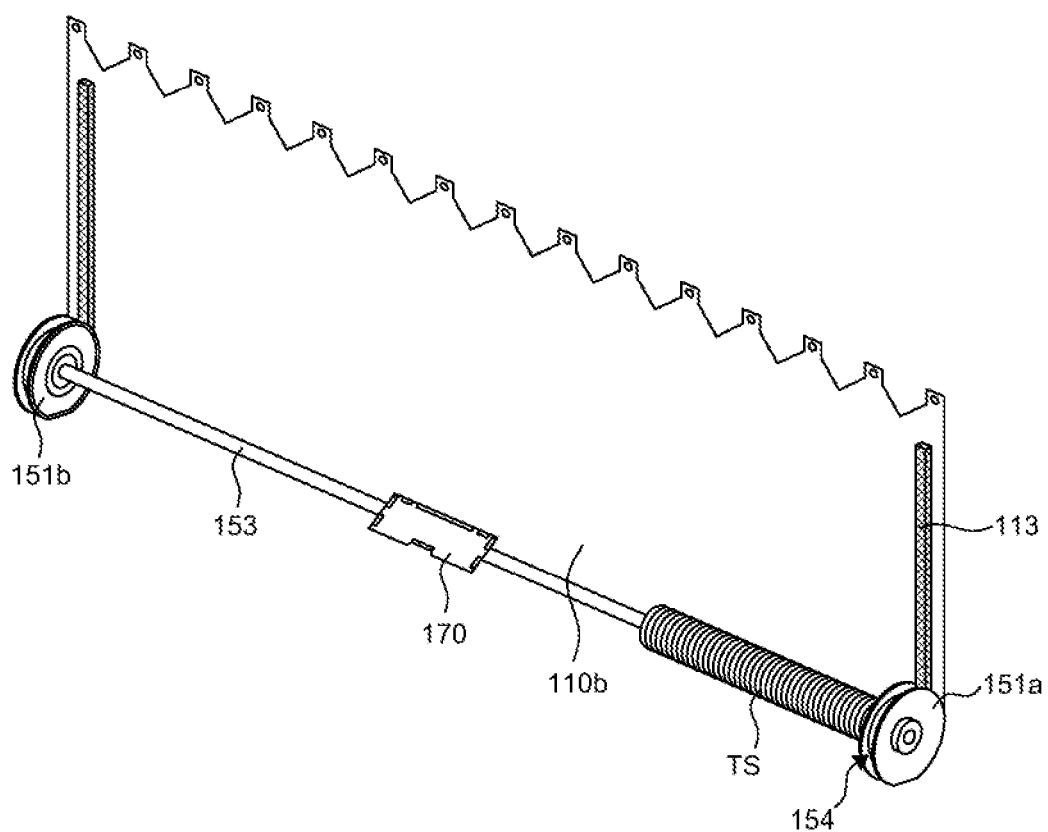
FIG. 5 is a perspective view for explaining a state in which the second back cover of the display device according to the aspect of the present disclosure is unwound.

Referring to FIG. 5, one end of the second back cover 110b is fixed to the first and second rolling guide parts 151a and 151b to be described below, and the other end of the second back cover 110b overlaps the first back cover 110a. The second back cover 110b may be fastened to the first back cover 110a and the rolling guide parts 151 and connect the first back cover 110a and the rolling guide parts 151. As described above, the second back cover 110b may connect the first back cover 110a and the rolling guide parts 151, and finally connect the rolling guide parts 151 and the display panel 120 disposed on the first back cover 110a. However, the present disclosure is not limited thereto. The shape of the second back cover 110b or the connection method may be variously changed in accordance with design as long as the second back cover 110b may be connected to the first back cover 110a and the rolling guide parts 151. However, the present disclosure is not limited thereto.

One end of the second back cover 110b is an uppermost end region of the second back cover 110b and may overlap one end of the first back cover 110a. For example, one end of the second back cover 110b may overlap the second support area PA2. One end of the second back cover 110b may be connected to and overlap a part of the first back cover 110a or connected to a part of the first back cover 110a by using a connection member or the like. However, the present disclosure is not limited thereto.

The second back cover 110b may include a plurality of fastening parts FP that overlap the first back cover 110a. The plurality of fastening parts FP are disposed at one end of the second back cover 110b. In addition, a plurality of third fastening holes AH3 may be respectively disposed in the plurality of fastening parts FP so as to be fastened to the first back cover 110a. The plurality of fastening parts FP having the plurality of third fastening holes AH3 are spaced apart from one another, such that a space in which the plurality of flexible films 130 may be bent may be ensured between the plurality of fastening parts FP. The third fastening holes AH3 may be holes for fixing the second back cover 110b and the cover part to be described below. FIG. 4A illustrates nine third fastening holes AH3. However, the number of third fastening holes AH3 is an example, and the present disclosure is not limited thereto.

FIG. 4A illustrates that the second fastening holes AH2 and the third fastening holes AH3 for fastening the cover part, the first back cover 110a, and the second back cover 110b are respectively disposed in the second support area PA2 of the first back cover 110a and one end of the second back cover 110b. However, the first back cover 110a, the second back cover 110b, and the cover part may be fixed to one another without a separate fastening hole.

Meanwhile, when the second support area PA2 and the plurality of fastening parts FP are wound around the rolling guide parts 151, the outer peripheral surfaces of the rolling guide parts 151 on which the second support area PA2 and the plurality of fastening parts FP overlap one another may be flat portions. Therefore, the second support area PA2 may be always kept flat regardless of a state in which the second support area PA2 is wound around or unwound from the rolling guide parts 151. The first printed circuit board 140 and the pad area at one end of the display panel 120 disposed on the second support area PA2 may also be kept flat.

A region from one end to the other end of the second back cover 110b is a region extending so that a display area AA of the display panel 120 may be disposed outside the housing part HP. For example, when the first back cover 110a and the display panel 120 are in the fully unwound state, the region from the other end of the second back cover 110b fixed to the rolling guide parts 151 to one end of the second back cover 110b at which the plurality of flexible films 130 and the first printed circuit board 140 are disposed may be disposed inside the housing part HP. The ductile area MA on which the display area AA of the display panel 120 is disposed and the first support area PA1 may be disposed outside the housing part HP. That is, the region from the other end of the second back cover 110b fixed to the rolling guide parts 151 to the second support area PA2 and at least a part of one end of the second back cover 110b may be disposed inside the housing part HP.

The other end of the second back cover 110b is a lowermost end region of the second back cover 110b that is fastened to the rolling guide parts 151. Fourth fastening holes AH4 may be formed at the other end of the second back cover 110b so that the second back cover 110b is fastened to the rolling guide parts 151. For example, fastening members are disposed to penetrate the rolling guide parts 151 and the fourth fastening holes AH4, such that the rolling guide parts 151 may be fastened to the other end of the second back cover 110b. Meanwhile, the other end of the second back cover 110b may be bonded to the rolling guide parts 151 by means of an adhesive tape instead of the fourth fastening holes AH4. Further, as the other end of the second back cover 110b is fastened or bonded to the rolling guide parts 151, the display panel 120, the first back cover 110a, and the second back cover 110b may be wound around or unwound from the rolling guide parts 151. FIG. 4A illustrates two fourth fastening holes AH4. However, the number of fourth fastening holes AH4 is not limited thereto.

Meanwhile, the plurality of opening portions 111, which are formed in the ductile area MA of the first back cover 110a, may not be formed in the second back cover 110b. Specifically, the third fastening holes AH3 and the fourth fastening holes AH4 are formed at one end and the other end of the second back cover 110b. However, the plurality of opening portions 111, which are formed in the ductile area MA of the first back cover 110a, are not formed in the second back cover 110b. In addition, the third fastening hole AH3 and the fourth fastening hole AH4 are different in shape from the plurality of opening portions 111.

The second back cover 110b may be made of a material having flexibility so that the second back cover 110b may be wound around or unwound from the rolling guide parts 151. For example, the second back cover 110b may be made of a plastic material such as polyethylene terephthalate (PET). However, the material of the second back cover 110b may be variously changed in accordance with design as long as the material of the second back cover 110b satisfies physical property conditions such as a thermal deformation amount, a radius of curvature, rigidity, and the like. However, the present disclosure is not limited thereto.

In the present specification, the configuration has been described in which the first back cover 110a and the second back cover 110b are separately formed. However, the present disclosure is not limited thereto. The first back cover 110a and the second back cover 110b may be integrated.

Referring to FIG. 4B, the display panel 120 is disposed on one surface of the first back cover 110a. The display panel 120 is disposed in the ductile area MA on one surface of the first back cover 110a. The display panel 120 is a panel configured to display images to a user. The display panel 120 may include a display element configured to display images, a driving element configured to operate the display element, and lines configured to transmit various types of signals to the display element and the driving element.

The display elements may have different configurations depending on the type of display panel 120. For example, in a case in which the display panel 120 is an organic light-emitting display panel 120, the display element may be an organic light-emitting element including an anode, an organic light-emitting layer, and a cathode. For example, in a case in which the display panel 120 is a liquid crystal display panel, the display element may be a liquid crystal display element. Hereinafter, the assumption is made that the display panel 120 is the organic light-emitting display panel. However, the display panel 120 is not limited to the organic light-emitting display panel. In addition, because the display device 100 according to the aspect of the present disclosure is a rollable display device 100, the display panel 120 may be implemented as a flexible display panel 120 so as to be wound around or unwound from the rolling guide parts 151.

The display panel 120 include the display area AA and a non-display area NA.

The display area AA is an area of the display panel 120 in which images are displayed. The display area AA may include a plurality of subpixels constituting the plurality of pixels, and a drive circuit configured to operate the plurality of subpixels. The plurality of subpixels is minimum units constituting the display area AA. The display element may be disposed in each of the plurality of subpixels. For example, the plurality of subpixels may each include the light-emitting element including an anode, a light-emitting part, and a cathode. However, the present disclosure is not limited thereto. In addition, the drive circuit configured to operate the plurality of subpixels may include driving elements, lines, and the like. For example, the drive circuit may include, but not limited to, a thin-film transistor, a storage capacitor, a gate line, a data line, and the like.

The non-display area NA is an area in which no image is displayed. Various lines and circuits for operating the organic light-emitting element in the display area AA are disposed in the non-display area NA. For example, the non-display area NA may include, but not limited to, link lines for transmitting signals to the plurality of subpixels and the drive circuit in the display area AA. The non-display area NA may include a drive IC such as a gate driver IC and a data driver IC.

Meanwhile, the non-display area NA includes a pad area.

The pad area is an area in which a plurality of pads are disposed. The plurality of pads are electrodes for electrically connecting the plurality of flexible films 130 and the display panel 120. The plurality of flexible films 130 and the display panel 120 may be electrically connected through the plurality of pads. In the non-display area NA, the pad area may be the non-display area NA that overlaps the second support area PA2 of the first back cover 110a. However, the pad area may be formed in another portion of the non-display area NA in accordance with the arrangement of the plurality of flexible films 130. However, the present disclosure is not limited thereto.

Referring to FIG. 4B, the plurality of flexible films 130 are disposed at one end of the display panel 120. The plurality of flexible films 130 each are a film having various types of components disposed on a base film 131 having ductility in order to supply signals to the plurality of subpixels constituting the plurality of pixels and to the drive circuit in the display area AA. The plurality of flexible films 130 may be electrically connected to the display panel 120. The plurality of flexible films 130 are disposed at one end of the non-display area NA of the display panel 120 and may supply power voltage, data voltage, and the like to the plurality of subpixels and the drive circuit in the display area AA. Meanwhile, FIG. 4B illustrates eight flexible films 130. However, the number of flexible films 130 may be variously changed in accordance with design. However, the present disclosure is not limited thereto.

The drive ICs 132 such as gate driver ICs and data driver ICs may be disposed on base films 131 of the plurality of flexible films 130. The drive IC 132 is a component configured to process data for displaying the image and process a driving signal for processing the data. The drive IC 132 may be disposed in ways such as a chip-on-glass (COG) method, a chip-on-film (COF) method, and a tape carrier package (TCP) method depending on how the drive IC is mounted. However, in FIG. 4B, for the convenience of description, the configuration has been described in which the drive ICs 132 are mounted on the plurality of flexible films 130 by the chip-on-film method. However, the present disclosure is not limited thereto.

Meanwhile, the plurality of flexible films 130 are components including the base films, the data drivers configured to display images on the base films, and the various types of drive ICs configured to control the data drivers. The plurality of flexible films 130 are components for displaying the images. The plurality of flexible films 130 are electrically connected to the pad area at one end of the display panel 120 and bent toward the rear surface of the first back cover 110a. One end of each of the plurality of flexible films 130 may be connected to one end of the display panel 120 on one surface of the first back cover 110a, and the other end of each of the plurality of flexible films 130 may be disposed on a surface of the first back cover 110a opposite to one surface of the first back cover 110a.

Referring to FIG. 4B, the first printed circuit board 140 is disposed on the rear surface of the first back cover 110a and connected to the plurality of flexible films 130. That is, the first printed circuit board 140 disposed adjacent to the rear surface of the first back cover 110a and electrically connected to the plurality of flexible films 130. The first printed circuit board 140 is a component configured to supply a signal to the drive IC of each of the plurality of flexible films 130. Various types of components for supplying the drive IC with various signals such as driving signals, data signals, and the like may be disposed on the first printed circuit board 140. Meanwhile, FIG. 4B illustrates two first printed circuit boards 140. However, the number of first printed circuit boards 140 may be variously changed in accordance with design. The present disclosure is not limited thereto.

<Shapes of Rolling Unit and Back Cover>

Figure 6:
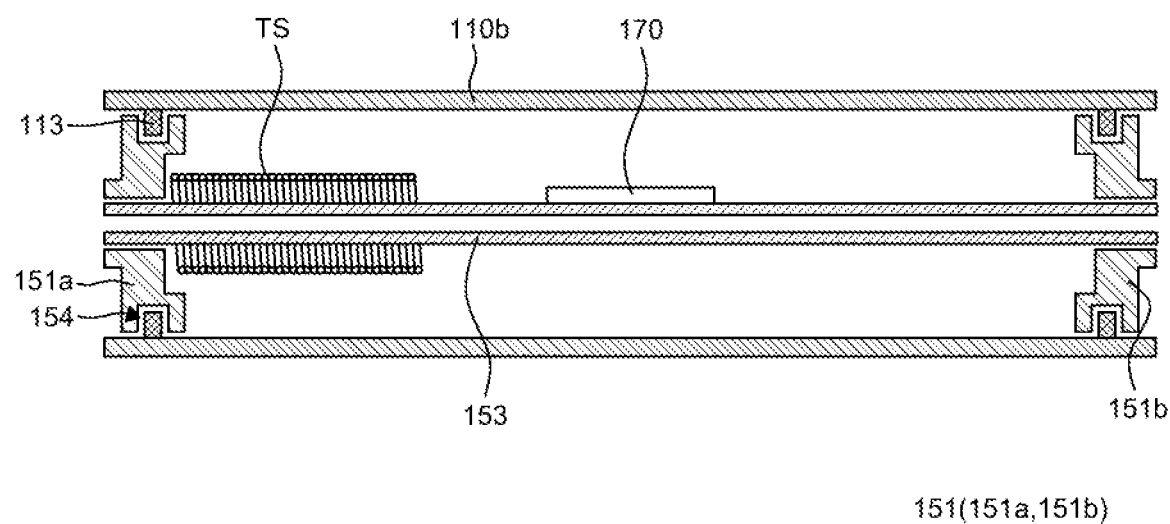
FIG. 6 is a cross-sectional view for explaining a state in which the second back cover of the display device according to the aspect of the present disclosure is wound.

FIG. 5 is a perspective view for explaining a state in which the second back cover of the display device according to the aspect of the present disclosure is unwound. FIG. 6 is a cross-sectional view for explaining a state in which the second back cover of the display device according to the aspect of the present disclosure is wound. For the convenience of illustration, FIGS. 5 and 6 illustrate only the second back cover 110b among the components of the display part DP. FIG. 5 is a view illustrating a state in which the display part DP is fully unwound around the rolling unit 150, and FIG. 6 is a view illustrating a state in which the display part DP is wound around the rolling unit 150 once.

Referring to FIG. 5, the connection shaft 153 has one end and the other end fastened to middle regions of the first and second rolling guide parts 151a and 151b. The connection shaft 153 is connected to the first and second rolling guide parts 151a and 151b and transmits rotational power. FIG. 5 illustrates that the connection shaft 153 has a cylindrical shape. However, the connection shaft 153 may have any shape capable of transmitting rotational power in addition to the cylindrical shape. In the case in which the connection shaft 153 has a cylindrical shape, the connection shaft 153 has a smaller diameter than each of the rolling guide parts 151.

A torsion spring TS is fastened to the connection shaft 153 and the first rolling guide parts 151a. The torsion spring TS may transmit power to a rotation of the connection shaft 153 by providing tension. The first and second rolling guide parts 151a and 151b may rotate as the tension is provided.

A second printed circuit board 170 is disposed on a central portion of the connection shaft 153 and electrically connected to the first printed circuit board 140. For example, the first printed circuit board 140 may be referred to as a source printed circuit board (source PCB; S-PCB) on which a data drive part is mounted. The second printed circuit board 170 connected to the first printed circuit board 140 may be referred to as a control printed circuit board (control PCB; C-PCB) on which a timing controller or the like is mounted. The second printed circuit board 170 may be fixed to the connection shaft 153 by means of a screw or fixed to the connection shaft 153 by means of an adhesive tape. Although not illustrated in the drawings, a flexible cable may electrically connect the first printed circuit board 140 and the second printed circuit board 170 and transmit an electrical signal to the display panel 110. For example, the flexible cable may be a flexible flat cable (FFC). However, the present disclosure is not limited thereto.

A part of the outer peripheral surface of the rolling guide part 151 is formed to be flat, and the remaining part of the outer peripheral surface of the rolling guide part 151 is formed to be curved. The second support area PA2 in which the first printed circuit board 140 and the flexible film 130 are disposed is wound while adjoining the flat portion of the rolling guide part 151, such that the second support area PA2 and the first printed circuit board 140 and the flexible film 130 in the second support area PA2 may be kept flat without being curved. Therefore, the flexible film 130 and the first printed circuit board 140 may be always kept flat regardless of the state in which the display part DP is wound or unwound. Therefore, it is possible to inhibit the flexible film 130 and the first printed circuit board 140 from being bent and damaged.

The first and second rolling guide parts 151a and 151b each include a groove portion 154 provided in a middle region thereof. As illustrated in FIG. 5, a cross-section of the groove portion 154 may have a ⊏ shape, a V shape, or a U shape. However, the present disclosure is not limited thereto.

Referring to FIG. 6, the back cover 110 is seated on the first and second rolling guide parts 151a and 151b. In other words, in the case in which the first and second rolling guide parts 151a and 151b each include the groove portion 154, the second back cover 110b includes a plurality of protruding portions 113. The plurality of protruding portions 113 of the second back cover 110b may be disposed to engage with the groove portions 154 of the first and second rolling guide parts 151a and 151b when the second back cover 110b is in the fully wound state. In the case in which the rolling guide parts 151 include the groove portions 154, the second back cover 110b include the plurality of protruding portions 113 corresponding to the groove portions 154. The protruding portions 113 may be disposed at two opposite ends of the second back cover 110b. The protruding portions 113 may be disposed in a row in a direction perpendicular to the connection shaft 153. The plurality of protruding portions 113 may be formed separately from the second back cover 110b and then attached or fastened to the second back cover 110b. However, the present disclosure is not limited thereto. As illustrated in FIGS. 5 and 6, the plurality of protruding portions 113 may each have a rectangular parallelepiped shape. However, the plurality of protruding portions 113 may each have a shape corresponding to the shape of the cross-section of the groove portion 154 of the rolling guide part 151. For the convenience of description, FIG. 6 illustrates that the groove portion 154 of each of the first and second rolling guide parts 151a and 151b is spaced apart from the protruding portion 113 of the second back cover 110b. However, the groove portion 154 and the protruding portion 113 may actually be disposed to adjoin each other.

The plurality of protruding portions 113 may have the same circumferential length as the groove portion 154 of each of the first and second rolling guide parts 151a and 151b. That is, the plurality of protruding portions 113 may have a length that may be wound around the groove portion 154 of the rolling guide part 151 once.

When the second back cover 110b is wound, the two opposite ends of the second back cover 110b adjoin the first and second rolling guide parts 151a and 151b, respectively. That is, the protruding portions 113 of the second back cover come into contact and engage with the groove portion 154 of the rolling guide part 151 when the second back cover 110b is wound. Therefore, the second back cover 110b may be wound at an exact position without slipping on an upper portion of the rolling guide part 151. The two opposite ends of the second back cover 110b are supported by the rolling guide parts 151 in the state in which the second back cover 110b is wound around the rolling guide parts 151 once. The cylindrical shape of the second back cover 110b may be maintained even though the middle portion of the second back cover 110b is not supported. Therefore, when the second back cover 110b is fully wound, the connection shaft 153 and the second printed circuit board 170 may be disposed in the cylindrical second back cover 110b. On the contrary, when the second back cover 110b is fully unwound, the second printed circuit board 170 and the torsion spring TS disposed above the connection shaft 153 are exposed. In other words, the second printed circuit board 170 and the torsion spring TS are present in the housing part HP and disposed above the connection shaft 153. However, the second printed circuit board 170 and the torsion spring TS are not disposed in a separate roller.

In a rollable display device in the related art, a back cover is wound so that a front surface of the other end of the back cover adjoins a roller. Therefore, the roller provides rigidity capable of supporting the back cover. However, a weight of the roller accounts for approximately ⅓ of an overall weight of the display device, for example. For this reason, the roller is excessively heavy in weight, which limits the implementation of a portable display device configured as a lightweight rollable display device.

The display device 100 according to the aspect of the present disclosure may be implemented as a rollable display device that is lightweight and replaces the heavy roller. That is, the rollable display device, in which the back cover 110 is wound while being supported on the rolling guide parts 151, may be implemented only by using the rolling guide parts 151 and the connection shaft 153 without using the roller that was used in general. Therefore, the display device 100 according to the aspect of the present disclosure may be implemented to be lightweight and portable.

In addition, in the display device 100 according to the aspect of the present disclosure, the two opposite ends of the back cover 110 are supported by the rolling guide parts 151. The central portion of the back cover 110, which does not adjoin the rolling guide parts 151, may be wound without sagging. In other words, the plurality of protruding portions 113 of the back cover 110 may be disposed to correspond to the groove portions 154 of the rolling guide parts 151, such that the plurality of protruding portions 113 may engage with the groove portions 154 when the back cover 110 is wound. Therefore, in the display device 100 according to the aspect of the present disclosure, the cylindrical shape of the wound back cover 110 may be maintained, and the plurality of protruding portions 113 and the groove portions 154 may inhibit the central portion of the back cover 110 from sagging.

Meanwhile, in the several aspects, the plurality of protruding portions 113 of the second back cover 110b may be configured as magnetic elements, and the first and second rolling guide parts 151a and 151b may be made of metal, such that a magnetic force may be formed between the plurality of protruding portions 113 of the second back cover 110b and the groove portions 154 of the first and second rolling guide parts 151a and 151b. Alternatively, magnetic elements may be attached to the protruding portions 113, and the first and second rolling guide parts 151a and 151b may be made of metal, such that a magnetic force is formed between the plurality of protruding portions 113 of the second back cover 110b and the groove portions 154 of the first and second rolling guide parts 151a and 151b. That is, the first and second rolling guide parts 151a and 151b may be made of metal, and the plurality of protruding portions 113 may be configured as magnetic elements, or magnetic elements may be attached to the plurality of protruding portions 113, such that a magnetic force may be formed between the plurality of protruding portions 113 and the groove portions 154 of the first and second rolling guide parts 151a and 151b. Therefore, an attachment force between the plurality of protruding portions 113 and the groove portions 154 of the first and second rolling guide parts 151a and 151b increases, such that the central portion of the back cover 110 is further inhibited from sagging. In this case, the available magnetic element may be a magnet or a rubber magnet, for example. In particular, when the rubber magnet is used as the magnetic element, a frictional force generated by the rubber material may also be added, it is possible to further inhibit the central portion of the back cover 110 from sagging.

Figure 7:
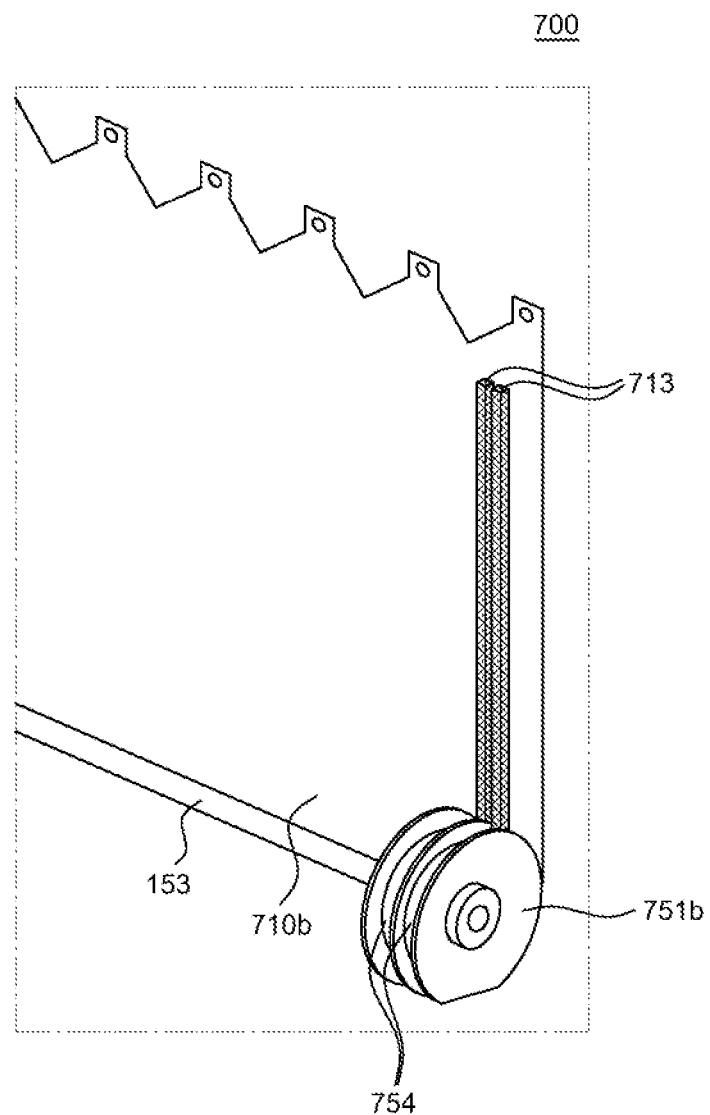
FIG. 7 is an enlarged perspective view illustrating a rolling guide part and a second back cover of a display device according to another aspect of the present disclosure.

FIG. 7 is an enlarged perspective view illustrating a rolling guide part and a second back cover of a display device according to another aspect of the present disclosure. The display device 700 illustrated in FIG. 7 is substantially identical in configuration to the display device 100 illustrated in FIGS. 1 to 6, except for a plurality of protruding portions 713 of a second back cover 710b. Therefore, repeated descriptions of the identical components will be omitted. For the convenience of illustration, FIG. 7 illustrates a part of the second back cover 710b among the components of the display part DP and illustrates only a second rolling guide part 751b and the connection shaft 153 among the components of the rolling unit. FIG. 7 illustrates only the second rolling guide part 751b between the first rolling guide part and the second rolling guide part 751b. However, the first rolling guide part may be identical to the second rolling guide part 751b.

Referring to FIG. 7, the first rolling guide part and the second rolling guide part 751b each include at least two groove portions 754. The plurality of protruding portions 713 of the second back cover 710b are disposed at two opposite sides of the second back cover 710b. The plurality of protruding portions 713 are disposed to extend in at least two rows in the direction perpendicular to the connection shaft 153. In this case, when the back cover is in the fully wound, one of the plurality of protruding portions 713 of the second back cover 710b is disposed to correspond to one of the groove portions 754. In the case in which the second rolling guide part 751b includes the plurality of groove portions 754, the plurality of protruding portions 713 are provided at one end of the second back cover 710b and correspond to the plurality of groove portions 754. The same configuration is also applied to the first rolling guide part and the other end of the second back cover 710b. For example, as illustrated in FIG. 7, the two groove portions 754 of each of the first rolling guide part and the second rolling guide part 751b may be continuously disposed. The two protruding portions 713 may be respectively disposed at one end and the other end of the second back cover 710b so that one protruding portion 713 corresponds to one groove portion 754. FIG. 7 illustrates that the plurality of protruding portions 713 are disposed in two rows and provided at the two opposite ends of the second back cover 710b. However, the number of protruding portions 713 respectively disposed at one end and the other end of the second back cover 710b is not limited thereto. In addition, the number of groove portions 754 of each of the first rolling guide part and the second rolling guide part 751b may be changed to be equal to the number of protruding portions 713. The plurality of protruding portions 713 are formed separately from the second back cover 710b and then attached or fastened to the second back cover 710b. The plurality of protruding portions 713 may be disposed in a rectangular parallelepiped shape. However, the plurality of protruding portions may each have a shape corresponding to the shape of the cross-section of the groove portion 754 of the rolling guide part.

In the display device 700 according to another aspect of the present disclosure, the heavy roller is eliminated, and the first rolling guide part, the second rolling guide part 751b, and the connection shaft 153 are disposed. Therefore, the display device 700 with lightweight and portable characteristics can be achieved.

In addition, in the display device 700 according to another aspect of the present disclosure, the two opposite ends of the back cover are supported by the first rolling guide part and the second rolling guide part 751b. Therefore, even the central portion of the back cover, which does not adjoin the rolling guide parts, may be wound without sagging. In other words, the plurality of protruding portions 713 of the second back cover 710b may engage with the plurality of groove portions 754 of the rolling guide parts when the second back cover 710b is wound. Therefore, in the display device 700 according to another aspect of the present disclosure, the cylindrical shape of the wound back cover may be maintained, and the plurality of protruding portions 713 and the plurality of groove portions 754 may more efficiently inhibit the central portion of the back cover from sagging.

Figure 8:
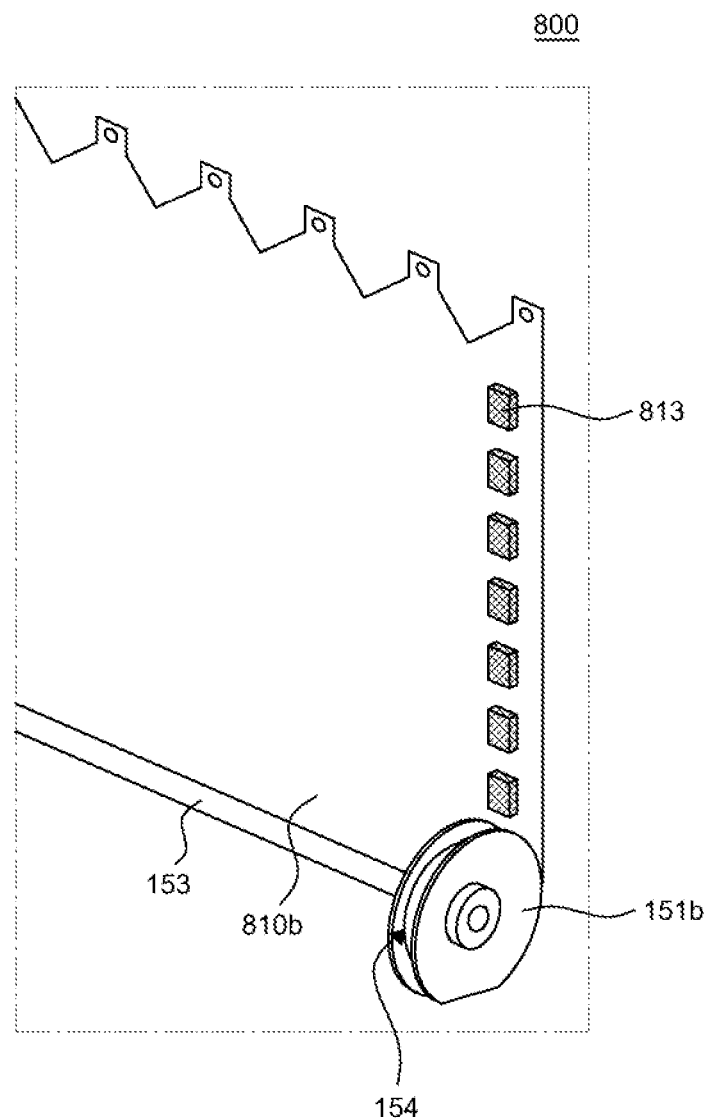
FIG. 8 is an enlarged perspective view illustrating a rolling guide part and a second back cover of a display device according to still another aspect of the present disclosure.

FIG. 8 is an enlarged perspective view illustrating a rolling guide part and a second back cover of a display device according to still another aspect of the present disclosure. The display device 800 illustrated in FIG. 8 is substantially identical in configuration to the display device 100 illustrated in FIGS. 1 to 6, except for a plurality of protruding portions 813 of a second back cover 810b. Therefore, repeated descriptions of the identical components will be omitted. For the convenience of illustration, FIG. 8 illustrates a part of the second back cover 810b among the components of the display part DP and illustrates only the second rolling guide part 151b and the connection shaft 153 among the components of the rolling unit.

Referring to FIG. 8, in the case in which the rolling guide parts 151 include the groove portions 154, the second back cover 810b include the plurality of protruding portions 813 corresponding to the groove portions 154. The plurality of protruding portions 813 may each include a plurality of patterns. The plurality of patterns of the plurality of protruding portions 813 may be provided at two opposite ends of the second back cover 810b and disposed in a row in the direction perpendicular to the connection shaft 153. The plurality of protruding portions 813 are formed separately from the second back cover 810b and then attached or fastened to the second back cover 810b. As illustrated in FIG. 8, the plurality of patterns of the plurality of protruding portions 813 may each have a rectangular parallelepiped shape. However, the plurality of patterns of the plurality of protruding portions may each have a shape corresponding to the shape of the cross-section of the groove portion 154 of the rolling guide part. The protruding portions 813, which is disposed at one end of the second back cover 810b and having the plurality of patterns disposed in a row, correspond to the groove portion 154 of the first rolling guide part. The protruding portions 813, which is disposed at the other end of the second back cover 810b and having the plurality of patterns disposed in a row, correspond to the groove portion 154 of the second rolling guide part.

In the display device 800 according to still another aspect of the present disclosure, the heavy roller in the related art is eliminated, and the first rolling guide part, the second rolling guide part 151b, and the connection shaft 153 are disposed. Therefore, it is possible to provide the display device 800 that is lightweight and portable.

In addition, in the display device 800 according to still another aspect of the present disclosure, the two opposite ends of the back cover are supported by the first rolling guide part and the second rolling guide part 151b. Therefore, even the central portion of the back cover, which does not adjoin the rolling guide parts, may be wound without sagging. In other words, the plurality of protruding portions 813 of the second back cover 810b, which include the plurality of patterns, may engage with the groove portions 154 of the first and second rolling guide parts when the second back cover 810b is wound. Therefore, in the display device 800 according to still another aspect of the present disclosure, the cylindrical shape of the wound back cover may be maintained, and the plurality of protruding portions 813 having the plurality of patterns and the groove portions 153 may more efficiently inhibit the central portion of the back cover from sagging.

In addition, in the display device 800 according to still another aspect of the present disclosure, the plurality of protruding portions 813 have the plurality of patterns. Therefore, it is possible to minimize a problem that the plurality of protruding portions 813 are separated from the second back cover 810b because of a level difference and curvature of the protruding portions 813 when the second back cover 810b is wound. In a case in which the plurality of protruding portions each have a single pattern, a slip may occur between the second back cover and the plurality of protruding portions while the second back cover is wound. Further, the second back cover and the plurality of protruding portions may be separated from one another because of a difference in extension length between the plurality of protruding portions disposed at the inside and the second back cover disposed at the outside. However, in the display device 800 according to still another aspect of the present disclosure, the plurality of protruding portions 813 each have the plurality of patterns. Therefore, a difference between an extension length of one pattern of the protruding portion 813 and an extension length of a region of the second back cover 810b corresponding to one pattern of the protruding portion 813 is smaller than a difference between an extension length of the protruding portion having the single pattern and an extension length of a region of the second back cover corresponding to the protruding portion having the single pattern. Therefore, in the display device 800 according to still another aspect of the present disclosure, a degree to which the slip occurs between the second back cover 810b and the plurality of patterns of the plurality of protruding portions 813 is significantly small even though the slip occurs between the second back cover 810b and the plurality of patterns of the plurality of protruding portions 813 while the second back cover 810b is wound. Therefore, it is possible to minimize the problem that the plurality of protruding portions 813 are separated from the second back cover 810b, thereby improving reliability.

Figure 9:
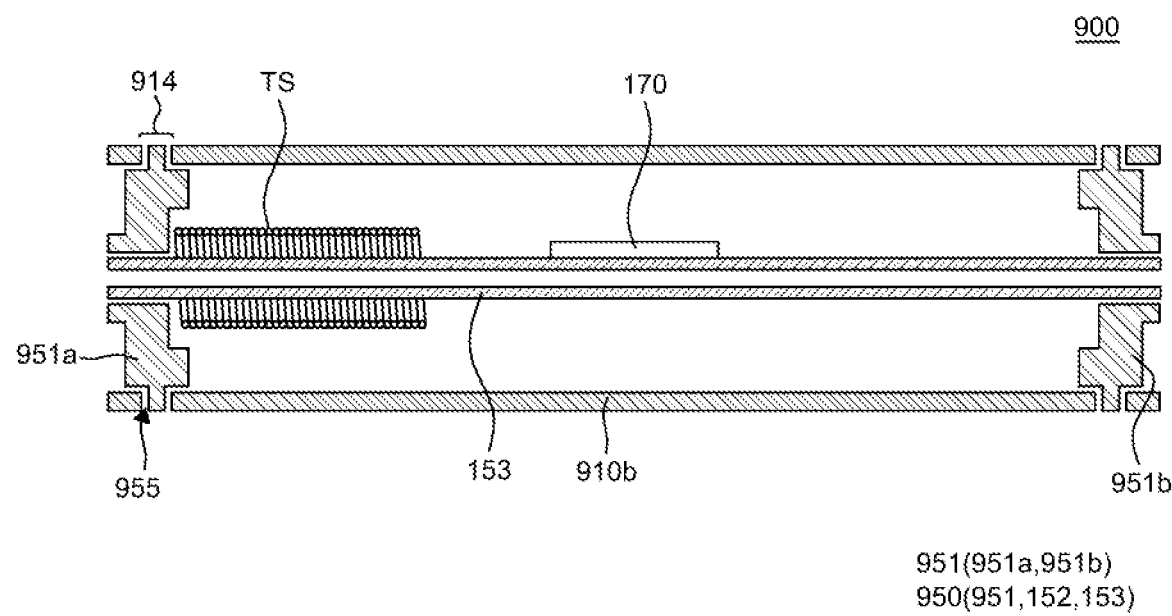
FIG. 9 is a cross-sectional view for explaining a state in which a second back cover of a display device according to yet another aspect of the present disclosure is wound.

FIG. 9 is a cross-sectional view for explaining a state in which a second back cover of a display device according to yet another aspect of the present disclosure is wound. The display device 900 illustrated in FIG. 9 is substantially identical in configuration to the display device 100 illustrated in FIGS. 1 to 6, except for a second back cover 910b and a rolling unit 950. Therefore, repeated descriptions of the identical components will be omitted. For the convenience of illustration, FIG. 9 illustrates only the second back cover 910b among the components of the display part DP. FIG. 9 is a view illustrating a state in which the display part DP is wound around the rolling unit 950 once.

Referring to FIG. 9, the first and second rolling guide parts 951a and 951b each include a protruding portion 955 provided in a middle region thereof. A height of the protruding portion 955 does not exceed a thickness of the second back cover 910b. This is to inhibit the first back cover wound on the second back cover 910b, which is wound previously, from being lifted up by the protruding portion 955 while the back cover is wound. As illustrated in FIG. 9, a cross-section of the protruding portion 955 may have a ⊏ shape, a V shape, or a U shape. However, the present disclosure is not limited thereto. The protruding portion 955 of the rolling guide part may be made of the same material as the rolling guide part 951 and integrated with the rolling guide part 951. However, the present disclosure is not limited thereto.

In the case in which the rolling guide part 951 includes the protruding portion 955, the second back cover 910b includes a plurality of groove portions 914 corresponding to the protruding portion 955. The plurality of groove portions 914 of the second back cover 910b are disposed to engage with the protruding portions 955 of the first and second rolling guide parts 951*a* and 951*b* when the second back cover 910*b* is in the fully wound state. The groove portions 914 may be provided at two opposite ends of the second back cover 910*b* and disposed in a row in the direction perpendicular to the connection shaft 153. As illustrated in FIG. 9, the plurality of groove portions 914 may each have any shape as long as the plurality of groove portions 914 engage with the protruding portions 955 of the rolling guide parts 951. For example, the plurality of groove portions 914 may each have a rectangular parallelepiped shape. However, the present disclosure is not limited thereto.

The plurality of groove portions 914 may have the same circumferential length as the rolling guide part 951. That is, the plurality of groove portions 914 may have a length that may be wound around the rolling guide part 951 once.

When the second back cover 910*b* is wound, the two opposite ends of the second back cover 910*b* adjoin the first and second rolling guide parts 951*a* and 951*b*, respectively. That is, the groove portion 914 of the second back cover and the protruding portion 955 of the rolling guide part are coupled while engaging with each other when the second back cover 910*b* is wound. Therefore, the second back cover 910*b* may be wound at an exact position without slipping on an upper portion of the rolling guide part 951. The two opposite ends of the second back cover 910*b* are supported by the rolling guide parts 951 in the state in which the second back cover 910*b* is wound around the rolling guide parts 951 once. The cylindrical shape of the second back cover 910*b* may be maintained even though the middle portion of the second back cover 910*b* is not supported. Therefore, when the second back cover 910*b* is wound, the connection shaft 153 and the second printed circuit board 170 may be disposed in the cylindrical second back cover 910*b*. On the contrary, when the second back cover 910*b* is fully unwound, the second printed circuit board 170 and the torsion spring TS disposed above the connection shaft 153 are exposed. In other words, the second printed circuit board 170 and the torsion spring TS are present in the housing part HP and disposed above the connection shaft 153. However, the second printed circuit board 170 and the torsion spring TS are not disposed in a separate roller.

In the display device 900 according to yet another aspect of the present disclosure, the heavy roller in the related art is eliminated, and the first rolling guide part 951*a*, the second rolling guide part 951*b*, and the connection shaft 153 are disposed. Therefore, it is possible to provide the display device 900 that is lightweight and portable.

In addition, in the display device 900 according to yet another aspect of the present disclosure, the two opposite ends of the back cover are supported by the first rolling guide part 951*a* and the second rolling guide part 951*b*. Therefore, even the central portion of the back cover, which does not adjoin the rolling guide parts 951, may be wound without sagging. In other words, the plurality of groove portions 914 of the second back cover 910*b* may engage with the protruding portions 955 of the rolling guide parts 951 when the second back cover 910*b* is wound. Therefore, in the display device 900 according to yet another aspect of the present disclosure, the cylindrical shape of the wound back cover may be maintained, and the plurality of protruding portions 955 and the plurality of groove portions 914 may more efficiently inhibit the central portion of the back cover from sagging.

Figure 10:
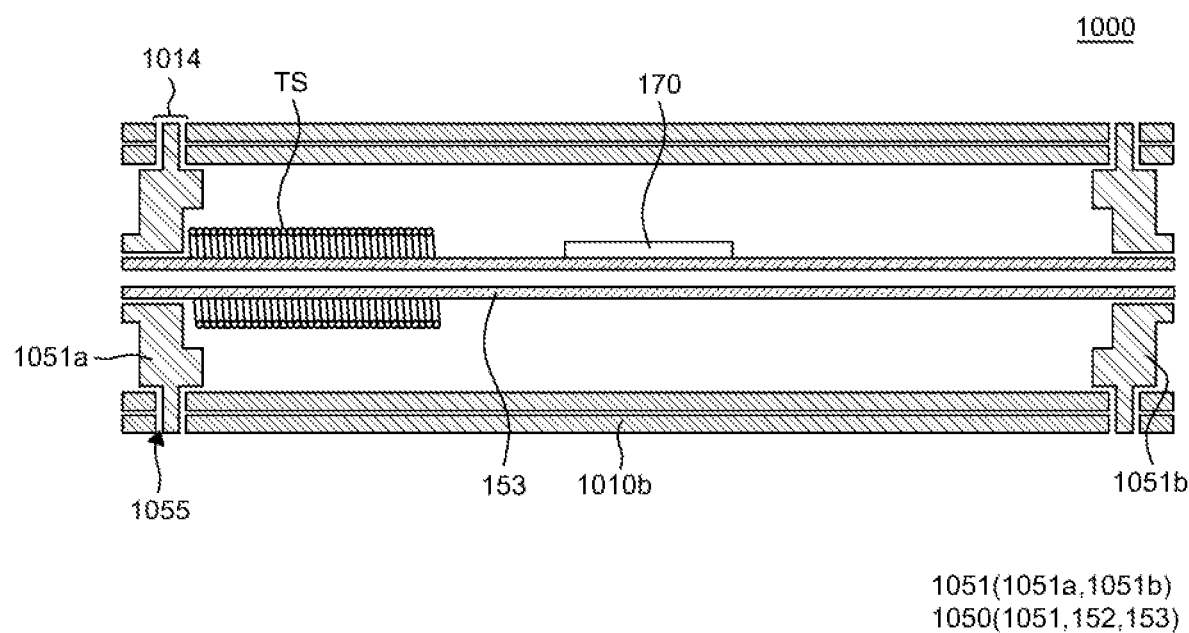
FIG. 10 is a cross-sectional view for explaining a state in which a second back cover of a display device according to still yet another aspect of the present disclosure is wound.

FIG. 10 is a cross-sectional view for explaining a state in which a second back cover of a display device according to still yet another aspect of the present disclosure is wound.

The display device 1000 illustrated in FIG. 10 is substantially identical in configuration to the display device 900 illustrated in FIG. 9, except for a second back cover 1010*b* and a rolling unit 1050. Therefore, repeated descriptions of the identical components will be omitted. For the convenience of illustration, FIG. 10 illustrates only the second back cover 1010*b* among the components of the display part DP. FIG. 10 is a view illustrating a state in which the display part DP is wound around the rolling unit 1050 twice.

Referring to FIG. 10, the first and second rolling guide parts 1051*a* and 1051*b* each include a protruding portion 1055 provided in a middle region thereof. A height of the protruding portion 1055 does not exceed a thickness of a structure in which the second back cover 1010*b* is doubly superimposed. This is to inhibit the first back cover wound on the second back cover 1010*b*, which is wound previously, from being lifted up by the protruding portion 1055 while the back cover is wound.

In the case in which the rolling guide part 1051 includes the protruding portion 1055, the second back cover 1010*b* includes a plurality of groove portions 1014 corresponding to the protruding portion 1055. The plurality of groove portions 1014 of the second back cover 1010*b* are disposed to engage with the protruding portions 1055 of the first and second rolling guide parts 1051*a* and 1051*b* when the second back cover 1010*b* is in the fully wound state. The groove portions 1014 may be provided at two opposite ends of the second back cover 1010*b* and disposed in a row in the direction perpendicular to the connection shaft 153.

The plurality of groove portions 1014 may have a circumferential length twice the circumferential length of the rolling guide part 1051. The plurality of groove portions 1014 may have a length that may be wound around the rolling guide part 1051 twice.

When the second back cover 1010*b* is wound, the two opposite ends of the second back cover 1010*b* adjoin the first and second rolling guide parts 1051*a* and 1051*b*, respectively. That is, the groove portion 1014 of the second back cover and the protruding portion 1055 of the rolling guide part are coupled while engaging with each other when the second back cover 1010*b* is wound. The second back cover 1010*b* may flatten the protruding portion 1055 of the rolling guide part when the second back cover 1010*b* is wound around the rolling guide part 1051 twice. Therefore, the second back cover 1010*b* may be wound at an exact position without slipping on an upper portion of the rolling guide part 1051. The two opposite ends of the second back cover 1010*b* are supported by the rolling guide parts 1051 in the state in which the second back cover 1010*b* is wound around the rolling guide parts 1051 twice. The cylindrical shape of the second back cover 1010*b* may be maintained even though the middle portion of the second back cover 1010*b* is not supported. Therefore, when the second back cover 1010*b* is wound, the connection shaft 153 and the second printed circuit board 170 may be disposed in the cylindrical second back cover 1010*b*. On the contrary, when the second back cover 1010*b* is fully unwound, the second printed circuit board 170 and the torsion spring TS disposed above the connection shaft 153 are exposed. In other words, the second printed circuit board 170 and the torsion spring TS are present in the housing part HP and disposed above the connection shaft 153. However, the second printed circuit board 170 and the torsion spring TS are not disposed in a separate roller.

In the display device 1000 according to still yet another aspect of the present disclosure, the heavy roller in the related art is eliminated, and the first rolling guide part 1051a, the second rolling guide part 1051b, and the connection shaft 153 are disposed. Therefore, it is possible to provide the display device 1000 that is lightweight and portable.

In addition, in the display device 1000 according to still yet another aspect of the present disclosure, the two opposite ends of the back cover are supported by the first rolling guide part 1051a and the second rolling guide part 1051b. Therefore, even the central portion of the back cover, which does not adjoin the rolling guide parts 1051, may be wound without sagging. In other words, the plurality of groove portions 1014 of the second back cover 1010b may engage with the protruding portions 1055 of the rolling guide parts 1051 when the second back cover 1010b is wound twice. Therefore, in the display device 1000 according to still yet another aspect of the present disclosure, a length of a portion where the second back cover 1010b and the rolling guide part 1051 engage with each other is increased, which makes it possible to more efficiently inhibit the central portion of the back cover from sagging.

Figure 11:
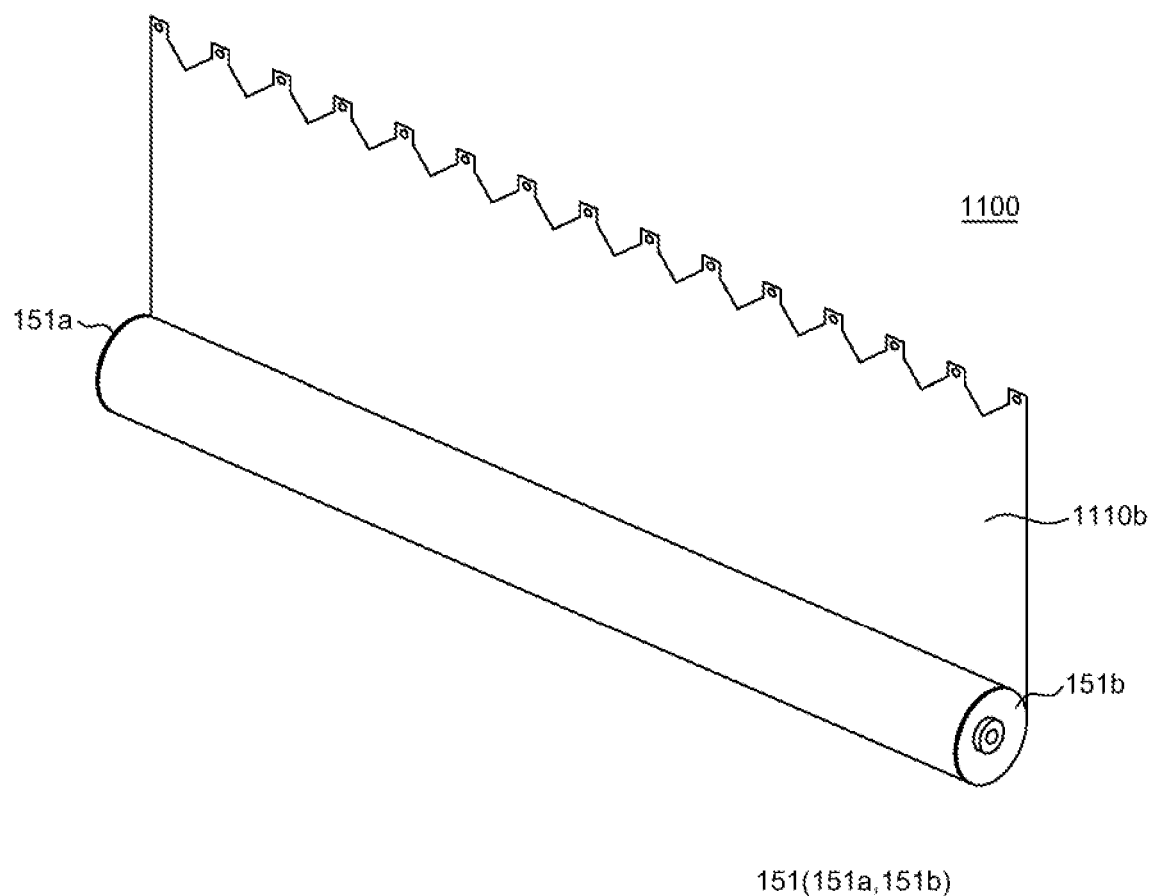
FIG. 11 is a perspective view for explaining a state in which a second back cover of a display device according to another further aspect of the present disclosure is unwound.

FIG. 11 is a perspective view for explaining a state in which a second back cover of a display device according to another further aspect of the present disclosure is unwound. The display device 1100 illustrated in FIG. 11 is substantially identical in configuration to the display device 100 illustrated in FIGS. 1 to 6, except for a second back cover 1110b. Therefore, repeated descriptions of the identical components will be omitted. For the convenience of illustration, FIG. 11 illustrates only the second back cover 1110b among the components of the display part DP.

Although not illustrated in FIG. 11, the first and second rolling guide part 151a and 151b each include the groove portion 154 provided in the middle region thereof, as illustrated in FIGS. 5 and 6. A cross-section of the groove portion 154 may have a ⊏ shape, a V shape, or a U shape. However, the present disclosure is not limited thereto.

In the case in which the rolling guide parts 151 include the groove portions 154, the second back cover 1110b include the plurality of protruding portions 113 corresponding to the groove portions 154. The protruding portions 113 may be disposed at two opposite ends of the second back cover 1110b. The protruding portions 113 may be disposed in a row in a direction perpendicular to the connection shaft 153. The plurality of protruding portions 113 are formed separately from the second back cover 1110b and then attached or fastened to the second back cover 1110b. The plurality of protruding portions 113 may be disposed in a rectangular parallelepiped shape. However, the plurality of protruding portions may each have a shape corresponding to the shape of the cross-section of the groove portion 154 of the rolling guide part.

The plurality of protruding portions 113 and the groove portions 154 of the rolling guide parts 151 may be attached to one another. The plurality of protruding portions 113 may be bonded to the groove portions 154 of the rolling guide parts 151 by means of a bondable material applied onto surfaces of the plurality of protruding portions 113. Alternatively, the plurality of protruding portions 113 may be fastened to the groove portions 154 of the rolling guide parts 151 by means of screws.

The plurality of protruding portions 113 may have a length equal to the circumferential length of the groove portion 154 of the rolling guide part 151. That is, the plurality of protruding portions 113 have a length that is wound around the groove portion 154 of the rolling guide part 151 once.

Referring to FIG. 11, when the back cover is fully unwound, a part of the second back cover 1110b is wound around the first and second rolling guide parts 1051a and 1051b once, thereby maintaining a cylindrical shape. That is, the plurality of protruding portions 113 of the second back cover 1110b and the groove portions 154 of the rolling guide parts 151 are kept attached to and engaging with one another. Therefore, the connection shaft 153, the second printed circuit board 170, and the torsion spring TS are disposed in the second back cover 1110b without being exposed even when the back cover is fully unwound.

The remaining part of the second back cover 1110b is supported by the cylindrical second back cover 1110b when the second back cover 1110b is wound. That is, the remaining part of the second back cover 1110b may be wound while adjoining a part of the cylindrical second back cover 1110b.

In the display device 1100 according to another further aspect of the present disclosure, the heavy roller in the related art is eliminated, and the first rolling guide part 151a, the second rolling guide part 151b, and the connection shaft 153 are disposed. Therefore, it is possible to provide the display device 1100 that is lightweight and portable. In particular, in the display device 1100 according to another further aspect of the present disclosure, the lightweight second back cover 1110b may provide the same function as the roller instead of the heavy roller.

In addition, in the display device 1100 according to still yet another aspect of the present disclosure, the two opposite ends of the back cover are supported by the first rolling guide part 151a and the second rolling guide part 151b. Therefore, even the central portion of the back cover, which does not adjoin the rolling guide parts 151, may be wound without sagging.

In addition, in the display device 1100 according to another further aspect of the present disclosure, the cylindrical shape, which is made by winding the second back cover 1110b around the rolling guide parts 151 once, may be always maintained. Therefore, the remaining part of the second back cover 1110b is supported by the second back cover 1110b that maintains the cylindrical shape when the second back cover 1110b is wound. Therefore, it is possible to additionally inhibit the central portion of the back cover from sagging.

<Modification of Connection Part>

Figure 12A:
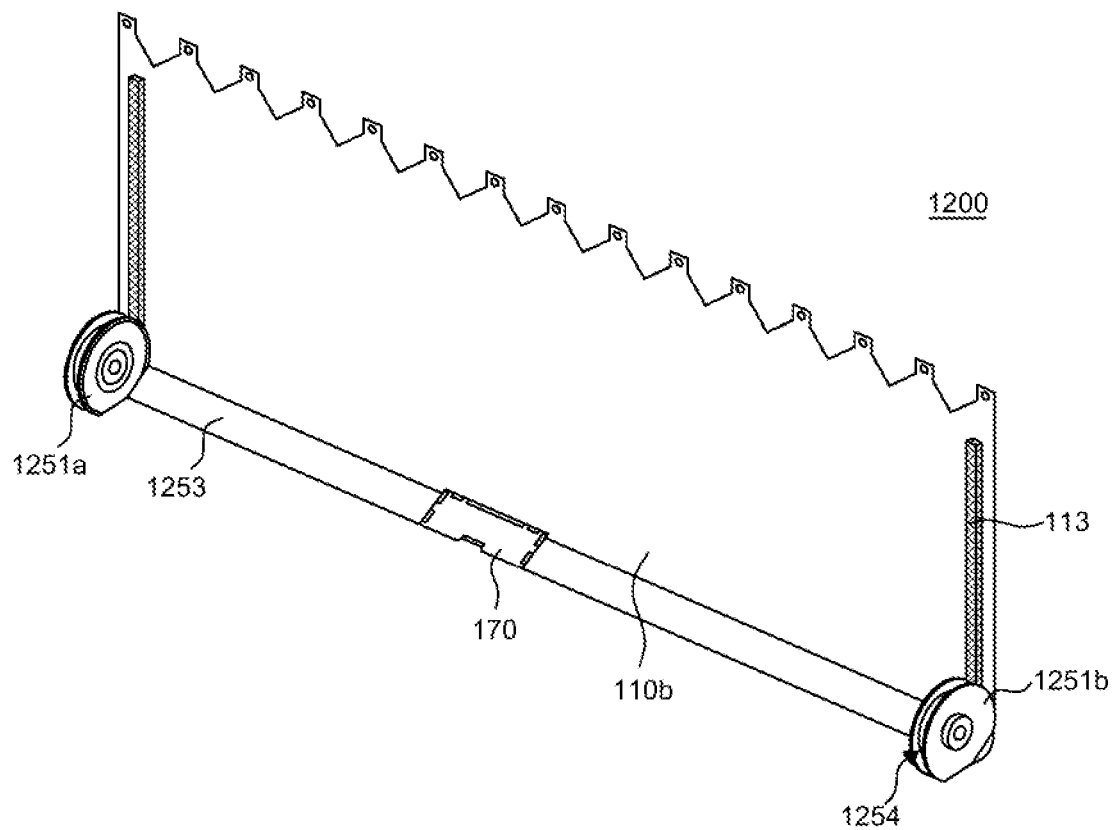
FIG. 12A is a perspective view for explaining a state in which a second back cover of a display device according to still another further aspect of the present disclosure is unwound.
Figure 12B:
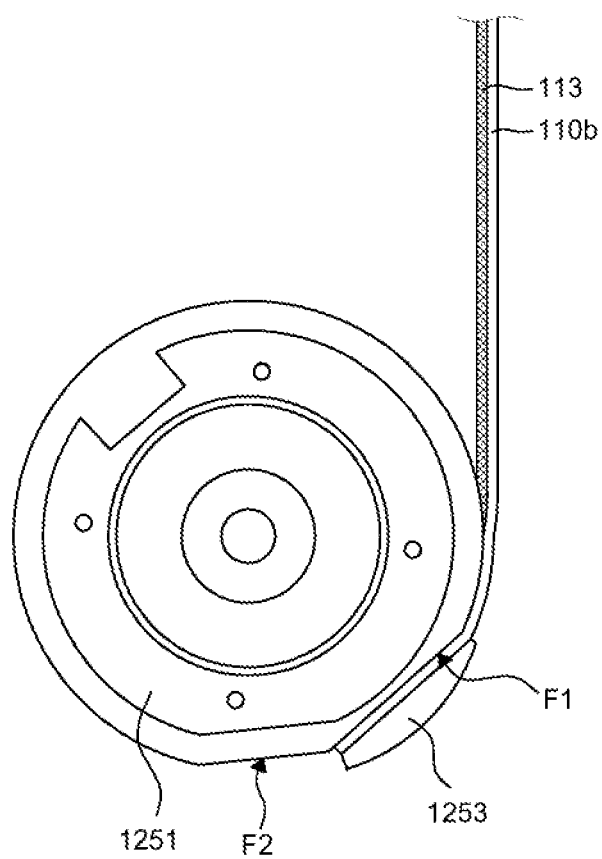
FIG. 12B is a cross-sectional view of the display device according to still another further aspect of the present disclosure.

FIG. 12A is a perspective view for explaining a state in which a second back cover of a display device according to still another further aspect of the present disclosure is unwound. FIG. 12B is a cross-sectional view of the display device according to still another further aspect of the present disclosure. The display device 1200 illustrated in FIGS. 12A and 12B is substantially identical in configuration to the display device 100 illustrated in FIGS. 1 to 6, except for a rolling unit 1250. Therefore, repeated descriptions of the identical components will be omitted. For the convenience of illustration, FIGS. 12A and 12B illustrate only the second back cover 110b among the components of the display part DP.

Referring to FIGS. 12A and 12B, the rolling unit 1250 includes: a first rolling guide part 1251a and a second rolling guide part 1251b; and a fastening bar 1253 disposed on outer peripheral surfaces of the first and second rolling guide parts 1251a and 1251b and having one end and the other end fastened to the first and second rolling guide parts 1251a and 1251b.

A part of an outer peripheral surface of the fastening bar 1253 has a curved surface corresponding to a cylindrical shape formed when the back cover 110 is in the fully wound state. The remaining part of the outer peripheral surface of the fastening bar 1253 has a flat surface. The flat surface of the fastening bar 1253 corresponds to a first flat portion F1 of flat surfaces of the outer peripheral surface of each of the first and second rolling guide parts 1251a and 1251b. The curved surface of the fastening bar 1253 corresponds to the cylindrical shape of the back cover when the back cover is in the fully wound state.

Fastening holes may be formed at one end and the other end of the fastening bar 1253 so as to be fastened to the rolling guide parts 1251 and the second back cover 110b. For example, fastening members may be disposed to penetrate the fastening holes of the fastening bar 1253, the fourth fastening holes AH4 of the second back cover 110b, and the rolling guide parts 1251, such that the rolling guide parts 1251, the second back cover 110b, and the fastening bar 1253 may be simultaneously fastened. Meanwhile, the fastening bar 1253 may be bonded to the second back cover 110b by means of an adhesive tape instead of the fastening holes of the fastening bar 1253.

The fastening bar 1253 is connected to the first and second rolling guide parts 1251a and 1251b and transmits rotational power. A spring tape may be fastened to the flat surface of the fastening bar 1253 and the first rolling guide part 1251a. The spring tape may transmit power to a rotation of the fastening bar 1253 by providing tension. The first and second rolling guide parts 1251a and 1251b may rotate as the tension is provided.

A part of the outer peripheral surface of the rolling guide part 1251 is formed to be flat, the first flat portion F1 of the flat surfaces corresponds to the fastening bar 1253. The remaining second flat portion F2, except for the first flat portion F1, corresponds to the second support area PA of the first back cover 110a when the display part DP is wound. The second support area PA2 in which the first printed circuit board 140 and the flexible film 130 are disposed is wound while adjoining the flat portion of the rolling guide part 1251, such that the second support area PA2 and the first printed circuit board 140 and the flexible film 130 in the second support area PA2 may be kept flat without being curved. Therefore, the flexible film 130 and the first printed circuit board 140 may be always kept flat regardless of the state in which the display part DP is wound or unwound. Therefore, it is possible to inhibit the flexible film 130 and the first printed circuit board 140 from being bent and damaged.

The second printed circuit board 170 is disposed on a central portion of the fastening bar 1253 and electrically connected to the first printed circuit board 140. For example, although not illustrated in the drawings, a support may be disposed between the second printed circuit board 170 and the central portion of the fastening bar 1253 so that the second printed circuit board 170 is disposed on the central portion of the rolling guide part 1251. The second printed circuit board 170 may be fixed to the support by means of an adhesive tape or screw.

The first and second rolling guide parts 1251a and 1251b each include a groove portion 1254 provided in a middle region thereof. In the case in which the rolling guide parts 1251 include the groove portions 1254, the second back cover 110b include the plurality of protruding portions 113 corresponding to the groove portions 1254. The protruding portions 113 may be disposed at two opposite ends of the second back cover 110b. The protruding portions 113 may be disposed in a row in a direction perpendicular to the connection shaft 153. The plurality of protruding portions 113 are formed separately from the second back cover 110b and then attached or fastened to the second back cover 110b.

When the second back cover 110b is wound, the two opposite ends of the second back cover 110b adjoin the first and second rolling guide parts 1251a and 1251b, respectively. That is, the protruding portions 113 of the second back cover come into contact and engage with the groove portion 1254 of the rolling guide part 1251 when the second back cover 110b is wound. In addition, a part of the wound second back cover 110b is supported by the fastening bar 1253. Therefore, the second back cover 110b may be wound at an exact position without slipping on an upper portion of the rolling guide part 1251. The two opposite ends of the second back cover 110b are supported by the rolling guide parts 1251 and the fastening bar 1253 in the state in which the second back cover 110b is wound around the rolling guide parts 1251 once. The cylindrical shape of the second back cover 110b may be maintained even though the middle portion of the second back cover 110b is not supported. Therefore, when the second back cover 110b is wound, the fastening bar 1253 and the second printed circuit board 170 may be disposed in the cylindrical second back cover 110b. On the contrary, when the second back cover 110b is fully unwound, the second printed circuit board 170 disposed above the fastening bar 1253 is exposed. In other words, the second printed circuit board 170 is present in the housing part HP and disposed above the fastening bar 1253. However, the second printed circuit board 170 is not disposed in a separate roller.

The display device 1200 according to still another further aspect of the present disclosure may be implemented as a display device that is lightweight and portable and replaces the heavy roller in the related art. That is, the roller in the related art is eliminated, and the rolling guide parts 1251 and the fastening bar 1253 are disposed, such that the rollable display device in which the back cover 110 is wound while being supported by the rolling guide parts 1251 and the fastening bar 1253 may be implemented.

In addition, in the display device 1200 according to still another further aspect of the present disclosure, the two opposite ends of the back cover are supported by the rolling guide parts 1251 and the fastening bar 1253. Therefore, even the central portion of the back cover 110, which does not adjoin the rolling guide part 151, may be wound without sagging. In other words, the plurality of protruding portions 113 may be disposed at the two opposite ends of the second back cover 110b and correspond to the groove portions 1254 of the rolling guide parts 1251, such that the plurality of protruding portions 113 may engage with the groove portions 1254 when the back cover 110 is wound. Furthermore, a part of the second back cover 110b is supported by the fastening bar 1253. Therefore, in the display device 1200 according to still another further aspect of the present disclosure, the cylindrical shape of the wound back cover 110 may be maintained, and the plurality of protruding portions 113 and the plurality of groove portions 1254 may more efficiently inhibit the central portion of the back cover 110 from sagging.

The exemplary aspects of the present disclosure can also be described as follows:

According to an aspect of the present disclosure, a display device may comprising: a first rolling guide parts and a second rolling guide parts each comprising at least one of a protruding portion and a groove portion; a connection part having one end fixed to the first rolling guide part and the other end fixed to the second rolling guide part; a back cover seated on the first and second rolling guide parts; and a display panel disposed on the back cover.

The back cover may comprise a first back cover disposed on a rear surface of the display panel and configured to support the display panel; and a second back cover having one end fixed to the first and second rolling guide parts and the other end configured to overlap the first back cover.

The connection part may be a connection shaft having one end and the other end fastened to middle regions of the first and second rolling guide parts.

The display device may further comprise a flexible film electrically connected to one end of the display panel and disposed on one surface of the first back cover; a first printed circuit board electrically connected to the flexible film and disposed on one surface of the first back cover; and a second printed circuit board electrically connected to the first printed circuit board and disposed on the connection shaft.

When the back cover is in a fully unwound state, the second back cover maintains a cylindrical shape formed by winding the second back cover around the first and second rolling guide parts once, and the connection shaft and the second printed circuit board may be disposed in the cylindrical second back cover.

The connection shaft and the second printed circuit board may be exposed when the back cover is in a fully unwound state.

The connection part may be a fastening bar disposed on outer peripheral surfaces of the first and second rolling guide parts.

The display device may further comprise a flexible film electrically connected to one end of the display panel and disposed on one surface of the first back cover; a first printed circuit board electrically connected to the flexible film and disposed on one surface of the first back cover; and a second printed circuit board electrically connected to the first printed circuit board and disposed on the fastening bar.

An outer peripheral surface of the fastening bar may have a curved surface corresponding to a cylindrical shape formed when the back cover is in a fully wound state.

The fastening bar and the second printed circuit board may be exposed when the back cover is in a fully unwound state.

The first and second rolling guide parts each comprise the protruding portion, and the second back cover comprises a plurality of groove portions, and the plurality of groove portions of the second back cover may be disposed to engage with the protruding portions of the first and second rolling guide parts when the second back cover is in a fully wound state.

The plurality of groove portions of the second back cover may have a length once or twice a circumferential length of each of the first and second rolling guide parts.

The first and second rolling guide parts each comprise the groove portion, and the second back cover comprises a plurality of protruding portions, and wherein the plurality of protruding portions of the second back cover may be disposed to engage with the groove portions of the first and second rolling guide parts when the second back cover is in a fully wound state.

The plurality of protruding portions of the second back cover are configured as magnetic elements, and the first and second rolling guide parts may be made of metal, such that a magnetic force is formed between the plurality of protruding portions of the second back cover and the groove portions of the first and second rolling guide parts.

The magnetic elements are attached to the plurality of protruding portions of the second back cover, and the first and second rolling guide parts may be made of metal, such that a magnetic force is formed between the plurality of protruding portions of the second back cover and the groove portions of the first and second rolling guide parts.

The plurality of protruding portions of the second back cover may have a length equal to a circumferential length of the groove portion of each of the first and second rolling guide parts.

The first and second rolling guide parts each comprise at least two groove portions, and the plurality of protruding portions of the second back cover provided at two opposite sides of the second back cover and disposed and extending in at least two rows in a direction perpendicular to the connection part, and wherein one of the plurality of protruding portions of the second back cover may correspond to one of the groove portions when the back cover is in a fully wound state.

The plurality of protruding portions of the second back cover may each comprise a plurality of patterns.

According to another aspect of the present disclosure, a display device may comprising: a display panel having a plurality of pixels; a back cover disposed on a rear surface of the display panel so as to be rollable together with the display panel; a first display device 100 and a second rolling guide parts around which the back cover and the display panel are wound or unwound, the first and second rolling guide parts each comprising at least one of a protruding portion and a groove portion and configured such that the back cover is seated on the first and second rolling guide parts; and a connection part having one end and the other end at which the first and second rolling guide parts are disposed.

The connection part is a connection shaft may have one end and the other end fastened to middle regions of the first and second rolling guide parts.

The connection part may be a fastening bar configured to adjoin a part of an outer peripheral surface of each of the first and second rolling guide parts.

The first and second rolling guide parts each comprise the protruding portion, and the back cover comprises a plurality of groove portions in a lower region of the display panel, and the plurality of groove portions of the back cover may be disposed to engage with the protruding portions of the first and second rolling guide parts when the back cover is in a fully wound state.

The first and second rolling guide parts each comprise the groove portion, the back cover comprises a plurality of protruding portions in a lower region of the display panel, and the plurality of protruding portions of the back cover may be disposed to engage with the groove portions of the first and second rolling guide parts when the back cover is in a fully wound state.

Although the exemplary aspects of the present disclosure have been described in detail with reference to the accompanying drawings, the present disclosure is not limited thereto and may be embodied in many different forms without departing from the technical concept of the present disclosure. Therefore, the exemplary aspects of the present disclosure are provided for illustrative purposes only but not intended to limit the technical concept of the present disclosure. The scope of the technical concept of the present disclosure is not limited thereto. Therefore, it should be understood that the above-described exemplary aspects are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device comprising:
   a first rolling guide parts and a second rolling guide parts each comprising at least one of a protruding portion and a groove portion;
   a connection part having one end fixed to the first rolling guide part and another end fixed to the second rolling guide part;
   a back cover seated on the first rolling guide parts and the second rolling guide parts; and
   a display panel disposed on the back cover,
   wherein the back cover includes a first back cover disposed on a rear surface of the display panel and configured to support the display panel; and a second back cover having one end fixed to the first rolling guide parts and the second rolling guide parts and another end configured to overlap the first back cover,
   wherein the connection part is a connection shaft having one end and another end fastened to middle regions of the first rolling guide parts and the second rolling guide parts, and
   the display device further includes a flexible film electrically connected to one end of the display panel and disposed on one surface of the first back cover;
   a first printed circuit board electrically connected to the flexible film and disposed on one surface of the first back cover; and
   a second printed circuit board electrically connected to the first printed circuit board and disposed on the connection shaft.

2. The display device of claim 1, wherein, when the back cover is in a fully unwound state, the second back cover maintains a cylindrical shape formed by winding the second back cover around the first rolling guide parts and the second rolling guide parts once, and the connection shaft and the second printed circuit board are disposed in the cylindrical second back cover.

3. The display device of claim 1, wherein the connection shaft and the second printed circuit board are exposed when the back cover is in a fully unwound state.

4. The display device of claim 1, wherein the connection part includes a fastening bar disposed on outer peripheral surfaces of the first rolling guide parts and the second rolling guide parts.

5. The display device of claim 4, further comprising:
   a flexible film electrically connected to one end of the display panel and disposed on one surface of the first back cover;
   a first printed circuit board electrically connected to the flexible film and disposed on one surface of the first back cover; and
   a second printed circuit board electrically connected to the first printed circuit board and disposed on the fastening bar.

6. The display device of claim 4, wherein an outer peripheral surface of the fastening bar has a curved surface corresponding to a cylindrical shape formed when the back cover is in a fully wound state.

7. The display device of claim 4, wherein the fastening bar and the second printed circuit board are exposed when the back cover is in a fully unwound state.

8. The display device of claim 1, wherein the first rolling guide parts and the second rolling guide parts each comprise the protruding portion, and the second back cover comprises a plurality of groove portions, and
   wherein the plurality of groove portions of the second back cover are disposed to engage with the protruding portions of the first rolling guide parts and the second rolling guide parts when the second back cover is in a fully wound state.

9. The display device of claim 8, wherein the plurality of groove portions of the second back cover have a length equal to or twice a circumferential length of each of the first rolling guide parts and the second rolling guide parts.

10. The display device of claim 1, wherein the first rolling guide parts and the second rolling guide parts each comprise the groove portion, and the second back cover comprises a plurality of protruding portions, and
    wherein the plurality of protruding portions of the second back cover are disposed to engage with the groove portions of the first rolling guide parts and the second rolling guide parts when the second back cover is in a fully wound state.

11. The display device of claim 10, wherein the plurality of protruding portions of the second back cover includes magnetic elements, and the first rolling guide parts and the second rolling guide parts are made of metal, such that a magnetic force is formed between the plurality of protruding portions of the second back cover and the groove portions of the first rolling guide parts and the second rolling guide parts.

12. The display device of claim 10, wherein the magnetic elements are attached to the plurality of protruding portions of the second back cover, and the first rolling guide parts and the second rolling guide parts are made of metal, such that a magnetic force is formed between the plurality of protruding portions of the second back cover and the groove portions of the first rolling guide parts and the second rolling guide parts.

13. The display device of claim 10, wherein the plurality of protruding portions of the second back cover have a length equal to a circumferential length of the groove portion of each of the first rolling guide parts and the second rolling guide parts.

14. The display device of claim 10, wherein the first rolling guide parts and the second rolling guide parts each comprise at least two groove portions, and the plurality of protruding portions of the second back cover provided at two opposite sides of the second back cover and disposed and extending in at least two rows in a direction perpendicular to the connection part, and
    wherein one of the plurality of protruding portions of the second back cover corresponds to one of the groove portions when the back cover is in a fully wound state.

15. The display device of claim 10, wherein the plurality of protruding portions of the second back cover each comprise a plurality of patterns.

16. A display device comprising:
    a display panel having a plurality of pixels;
    a back cover disposed on a rear surface of the display panel and rollable together with the display panel;
    a first rolling guide parts and a second rolling guide parts around which the back cover and the display panel are wound or unwound, the first rolling guide parts and the second rolling guide parts each comprising at least one of a protruding portion and a groove portion and configured such that the back cover is seated on the first rolling guide parts and the second rolling guide parts; and a connection part having one end and another end at which the first rolling guide parts and the second rolling guide parts are disposed, wherein the connection part is a connection shaft having one end and another end fastened to middle regions of the first rolling guide parts and the second rolling guide parts, and the display device further includes a flexible film electrically connected to one end of the display panel and disposed on one surface of the back cover;

a first printed circuit board electrically connected to the flexible film and disposed on one surface of the back cover; and a second printed circuit board electrically connected to the first printed circuit board and disposed on the connection shaft.

17. The display device of claim 16, wherein the connection part is a fastening bar configured to adjoin a part of an outer peripheral surface of each of the first rolling guide parts and the second rolling guide parts.

18. The display device of claim 16, wherein the first rolling guide parts and the second rolling guide parts each comprise the protruding portion, and the back cover comprises a plurality of groove portions in a lower region of the display panel, and wherein the plurality of groove portions of the back cover is disposed to engage with the protruding portions of the first rolling guide parts and the second rolling guide parts when the back cover is in a fully wound state.

19. The display device of claim 16, wherein the first rolling guide parts and the second rolling guide parts each comprise the groove portion, the back cover comprises a plurality of protruding portions in a lower region of the display panel, and wherein the plurality of protruding portions of the back cover are disposed to engage with the groove portions of the first rolling guide parts and the second rolling guide parts when the back cover is in a fully wound state.

* * * * *